(12) United States Patent
Ito

(10) Patent No.: US 6,930,559 B2  
(45) Date of Patent: Aug. 16, 2005

(54) OSCILLATION STATE DISCRIMINATION CIRCUIT AND OSCILLATION CONTROL CIRCUIT ADAPTED TO OSCILLATION CIRCUIT

(75) Inventor: Masahiro Ito, Iwata (JP)

(73) Assignee: Yamaha Corporation, Hamamatsu (JP)

( * ) Notice: Subject to any disclaimer, the term of this patent is extended or adjusted under 35 U.S.C. 154(b) by 58 days.

(21) Appl. No.: 10/462,406

(22) Filed: Jun. 16, 2003

(65) Prior Publication Data

US 2003/0231065 A1 Dec. 18, 2003

(30) Foreign Application Priority Data

Jun. 18, 2002 (JP) ........................................ 2002-177609

(51) Int. Cl.[7] .............................. H03B 5/36; H03L 7/095; H03L 7/10
(52) U.S. Cl. ............................ 331/18; 331/1 A; 331/64; 331/158; 331/DIG. 2
(58) Field of Search .......................... 331/1 A, 18, 64, 331/116 R, 116 FE, 158, 173, DIG. 2

(56) References Cited

U.S. PATENT DOCUMENTS 6,154,097 A * 11/2000 Yoshioka ..................... 331/18

FOREIGN PATENT DOCUMENTS

JP 8065049 3/1996
JP 0927717 1/1997

* cited by examiner

*Primary Examiner*—David Mis
(74) *Attorney, Agent, or Firm*—Pillsbury Winthrop Shaw Pittman LLP

(57) ABSTRACT

An oscillation control circuit comprising a PLL circuit and a phase-locked state discrimination circuit is adapted to an oscillation circuit that performs oscillation to produce an oscillation signal (CKX) when supply voltage is applied thereto. The PLL circuit produces a clock signal (CKP) whose frequency is a multiple of the frequency of the oscillation signal, wherein it controls the clock signal to be synchronized with the oscillation signal in phase. The phase-locked state discrimination circuit discriminates whether or not the PLL circuit is placed in a phase-locked state on the basis of a phase relationship between the oscillation signal and clock signal. Based on a discrimination result, a damping resistance adapted to the oscillation circuit is switched over. That is, the damping resistance (Rd) is reduced to cope with an unstable state of oscillation; then, it is restored to an original resistance thereof when oscillation is certainly stabilized.

11 Claims, 13 Drawing Sheets

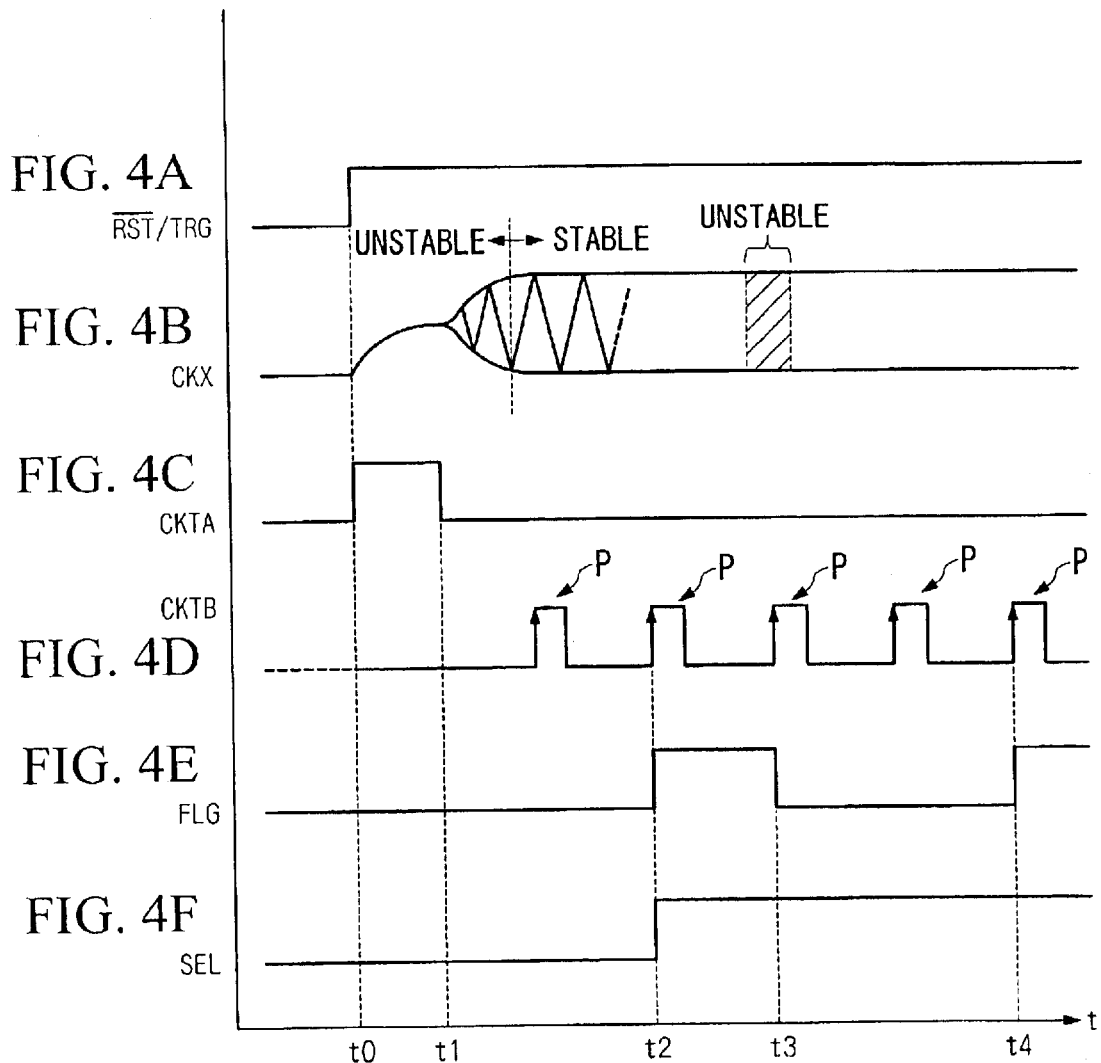

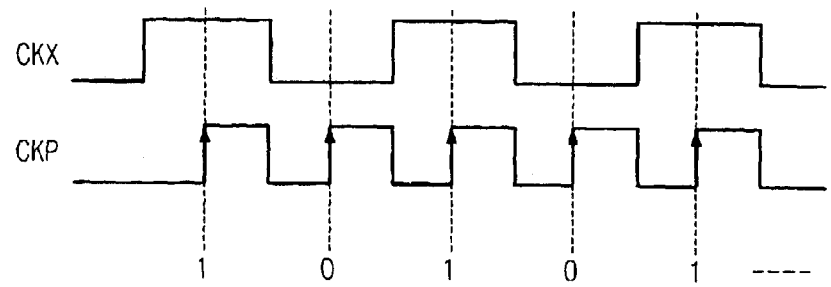
FIG. 5A CKX
FIG. 5B CKP
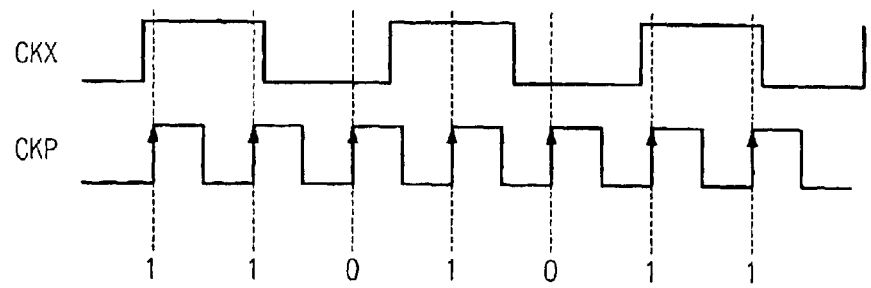
FIG. 5C CKX
FIG. 5D CKP
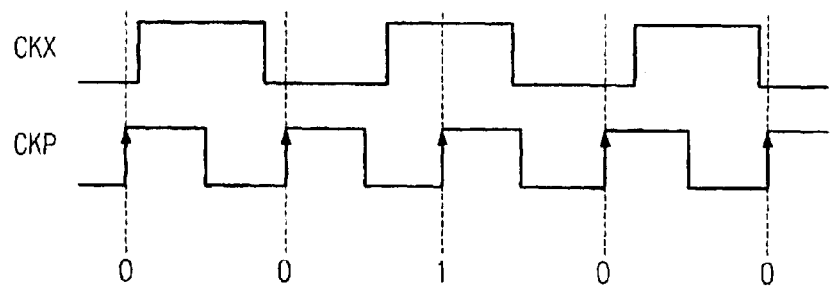
FIG. 5E CKX
FIG. 5F CKP

FIG. 11A VDD

FIG. 11B CKX

FIG. 11C $\overline{RST}$

FIG. 11D WIN

FIG. 11E CLK (CLOCK OUTPUT)

FIG. 13
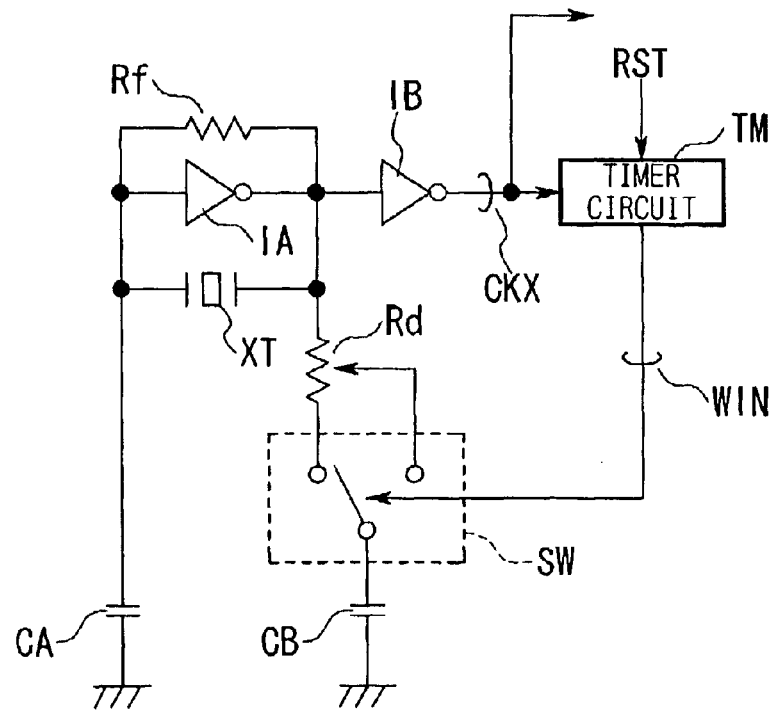
FIG. 14A    VDD
FIG. 14B    CKX
FIG. 14C    WIN

OSCILLATION STATE DISCRIMINATION CIRCUIT AND OSCILLATION CONTROL CIRCUIT ADAPTED TO OSCILLATION CIRCUIT

BACKGROUND OF THE INVENTION

1. Field of the Invention

This invention relates to oscillation state discrimination circuits that discriminate oscillation states of oscillation circuits such as crystal oscillators. In addition, this invention also relates to oscillation control circuits that control oscillation states and oscillation outputs of oscillation circuits, particularly in initial periods of oscillation.

2. Description of the Related Art

Conventionally, a variety of oscillation circuits using quartz oscillators (namely, crystal oscillators) have been widely used and installed in electronic devices, wherein quartz oscillators are reduced in sizes to match recent electronic devices, which tend to be compact and downsized to satisfy consumers' demands. Although quartz oscillators are reduced in sizes, they may be easily damaged due to excitation signals applied thereto. For this reason, so-called damping resistors are arranged for oscillation circuits to suppress levels of excitation signals exciting quartz oscillators so that oscillation states will be maintained in a stable manner.

Damping resistors operate to suppress excitations of quartz oscillators, wherein they have a drawback in that a relatively long time is required to stabilize oscillation states particularly in initial periods of oscillations just after applying electric power therefor. In order to solve the aforementioned drawback, a so-called damping resistance changeover method is adapted in such a way that damping resistors are controlled to be reduced in effective resistances in initial periods of oscillations; then, they are restored to original resistances thereof.

FIG. 13 shows an example of an oscillation circuit using a damping resistance changeover method that is conventionally known. Herein, a quartz oscillator XT defining an oscillation frequency is arranged between an input terminal and an output terminal of an inverter IA, which in turn functions as an inverting amplifier for exciting the quartz oscillator XT. A resistor Rf defining an operating point of the inverter IA is also arranged between the input terminal and output terminal of the inverter IA. To cause oscillation in the oscillation circuit of FIG. 13, a gain of the inverter IA in a small-amplitude mode should exceed a loss of the crystal oscillator XT. Therefore, the operating point of the inverter IA is set by adjusting the resistor Rf in order to produce a gain that may exceed the loss of the crystal oscillator XT.

A damping resistance Rd (i.e., a damping resistor having a resistance Rd that is controlled to be varied or switched over) is used to control a level of an excitation signal exciting the quartz oscillator XT, wherein a switch SW is used to change over the damping resistance Rd. Capacitors CA and CB are used to remove higher harmonics components from an oscillation waveform that is produced by exciting the quartz oscillator XT in the oscillation circuit. An oscillation signal appears on the output terminal of the inverter IA and is then subjected to waveform shaping in an inverter IV, which in turn produces a clock signal CKX. A timer circuit TM starts to measure a prescribed time period upon receipt of a trigger, i.e., a reset signal RST, wherein it outputs an window signal WIN having a high level during measurement. The aforementioned time period measured by the timer circuit TM may be sufficiently increased to include an unstable time period of oscillation (e.g., a transient time period of supply voltage).

The overall operation of the conventional oscillation circuit of FIG. 13 will be described below.

First, a description will be given with respect to a stable state of oscillation that is established upon elapse of a certain time after applying supply voltage. In this case, the timer circuit TM does not operate so that a contact of the switch SW is fixed to actualize a normal resistance for the damping resistor 'Rd', wherein the inverter IA and the quartz oscillator XT forms a negative feedback loop to cause oscillation, so that an oscillation signal appears on the output terminal of the inverter IA. When an oscillation frequency deviates from a characteristic frequency (or natural frequency) of the quartz oscillator XT, the quartz oscillator XT may indicate an inductive property or a capacitive property in response to a deviating direction of frequency. As a result, the oscillation frequency is stabilized in proximity to the characteristic frequency of the quartz oscillator XT, so that the inverter IB produces a clock signal CKX whose frequency may substantially match the characteristic frequency of the quartz oscillator XT. This clock signal CKX is supplied to circuitry (not shown) to operate.

Next, an unstable state of oscillation that occurs just after applying supply voltage will be described with reference to FIGS. 14A to 14C. At time t11, supply voltage VDD (see FIG. 14A) is applied to the oscillation circuit of FIG. 13, wherein it is gradually increased in level in response to a certain time constant. When the inverter IA starts amplification upon receipt of the supply voltage VDD, oscillation is started so that the inverter IB starts to produce a clock signal CKX (see FIG. 14B).

At time t11 when the supply voltage VDD is applied, the timer circuit TM may receive a reset signal RST from a system (not shown) that uses the oscillation circuit of FIG. 13, wherein the reset signal RST is produced by the system upon detection of applying the supply voltage VDD. Therefore, the timer circuit TM is reset by the reset signal RST and then starts counting a prescribed time period until time t12. During measurement, the timer circuit TM produces a window signal WIN (see FIG. 14C) having a high level, which may be sustained between time t11 and time t12. The window signal WIN is supplied to the switch SW, which is thus controlled in switching operation.

Specifically, the timer TM starts measuring time at time t11, so that the window signal WIN turns to a high level. In response to the window signal WIN, the switch SW is controlled to adequately switch over the contact thereof to reduce the damping resistance Rd. That is, suppression of an excitation level controlled by the damping resistance Rd is released so that oscillation is controlled to be rapidly stabilized. At time t12 when the timer circuit TM completes measuring a prescribed time period, the window signal WIN turns to a low level. At this time, the switch SW switches over the contact thereof so that the damping resistance Rd is restored to an original resistance thereof. Thus, it is possible to suppress an excitation level of the quartz oscillator XT to a certain level realizing oscillation to be maintained in a stable manner.

The prescribed time period measured by the timer circuit TM is set to include an unstable time period of oscillation (or a transient time period of supply voltage) as described above. That is, at time t12 when the switch SW is switched over, oscillation of the oscillation circuit has been already stabilized. Therefore, even when the damping resistance Rd is restored to an original resistance thereof, oscillation of the oscillation circuit would not become unstable so that oscillation is maintained in a stable manner.

In the conventional example of the oscillation circuit, the damping resistance Rd is reduced during a prescribed time period in an initial period of oscillation so that oscillation can be rapidly stabilized; then, after elapse of the prescribed time period, the damping resistance Rd is restored to an original resistance thereof so that oscillation will be maintained in a stable manner.

In the above, the time length of an unstable period of oscillation that emerges just after applying supply voltage to the oscillation circuit may highly depend upon uncertain elements such as time constants of a voltage supply (or a power supply). In order to securely restore the damping resistance Rd to an original resistance thereof after oscillation is certainly stabilized, it is necessary to increase the prescribed time period (i.e., a time measurement period of the timer circuit TM) to be sufficiently long. However, when the time measurement period of the timer circuit TM is set to be sufficiently long, the damping resistance Rd should be continuously reduced to a certain small resistance for a while even when oscillation is stabilized, which in turn increases an excitation level applied to the quartz oscillator XT. This causes a relatively intense stress on the quartz oscillator XT, which may be easily damaged. In addition, when an external device inputs an oscillation signal that is produced by the oscillation circuit whose oscillation is unstable, there is a possibility that the external device may operate abnormally.

SUMMARY OF THE INVENTION

It is an object of the invention to provide an oscillation state discrimination circuit and an oscillation control circuit, which can rapidly switch over a damping resistance upon discrimination of an oscillation state of the oscillation circuit, wherein it is possible to prevent the oscillation circuit from producing an unstable oscillation signal, thus preventing an external device from operating abnormally.

An oscillation control circuit of this invention comprising a PLL circuit and a phase-locked state discrimination circuit is adapted to an oscillation circuit that performs oscillation to produce an oscillation signal when supply voltage is applied thereto. The PLL circuit produces a clock signal whose frequency is a multiple of the frequency of the oscillation signal, wherein it controls the clock signal to be synchronized with the oscillation signal in phase. The phase-locked state discrimination circuit discriminates whether or not the PLL circuit is placed in a phase-locked state on the basis of a phase relationship between the oscillation signal and clock signal. Based on a discrimination result, a damping resistance adapted to the oscillation circuit is switched over. That is, when the PLL circuit is not placed in a phase-locked state, in other words, when the clock signal is not synchronized with the oscillation signal, the damping resistance is reduced to cope with an unstable state of oscillation, which may occur in an initial period of oscillation caused in the oscillation circuit, thus preventing a quartz oscillator from being damaged. When oscillation is certainly stabilized, the damping resistance is rapidly restored to an original resistance thereof.

In the above, a timer is used to measure a prescribed time period and to provide a signal for switching over the damping resistance, wherein the prescribed time period is adequately adjusted to improve a precision for discriminating whether or not oscillation is stabilized.

BRIEF DESCRIPTION OF THE DRAWINGS

These and other objects, aspects, and embodiments of the present invention will be described in more detail with reference to the following drawings, in which:

FIG. 4A shows a control signal $\overline{\text{RST}}$/TRG supplied to the oscillation control circuit shown in FIG. 1;

FIG. 4B shows an oscillation circuit CKX output from the oscillation circuit OSC shown in FIG. 1;

FIG. 4C shows a signal CKTA output from a timer shown in FIG. 2;

FIG. 4D shows a signal CKTB output from a timer shown in FIG. 2;

FIG. 4E shows a signal FLG output from the phase-locked state discrimination circuit of FIG. 2;

FIG. 4F shows a signal SEL output from the phase-locked state discrimination circuit to switch over a switch shown in FIG. 1;

FIG. 5A shows an oscillation signal CKX;

FIG. 5B shows a clock signal CKP that is synchronized with the oscillation signal CKX shown in FIG. 5A and whose frequency matches a double frequency of the oscillation signal CKX;

FIG. 5C shows an oscillation signal CKX;

FIG. 5D shows a clock signal CKP that is not synchronized with the oscillation signal CKX shown in FIG. 5C and whose frequency is increased to be slightly greater than a double frequency of the oscillation signal CKX;

FIG. 5E shows an oscillation signal CKX;

FIG. 5F shows a clock signal CKP that is not synchronized with the oscillation signal CKX shown in FIG. 5E and whose frequency is decreased to be slightly less than double the frequency of the oscillation signal CKX;

FIG. 13 is a circuit diagram showing a conventional example of an oscillation circuit in which a damping resistor is adequately changed over in resistance in an initial period of oscillation;

FIG. 14A shows a waveform of a supply voltage VDD in a transient period;

FIG. 14B shows a waveform of a clock signal CKX; and

FIG. 14C shows a waveform of a window signal WIN representing a prescribed time period in which the damping resistor is temporarily reduced in resistance in FIG. 13.

DESCRIPTION OF THE PREFERRED EMBODIMENTS

Figure 1:
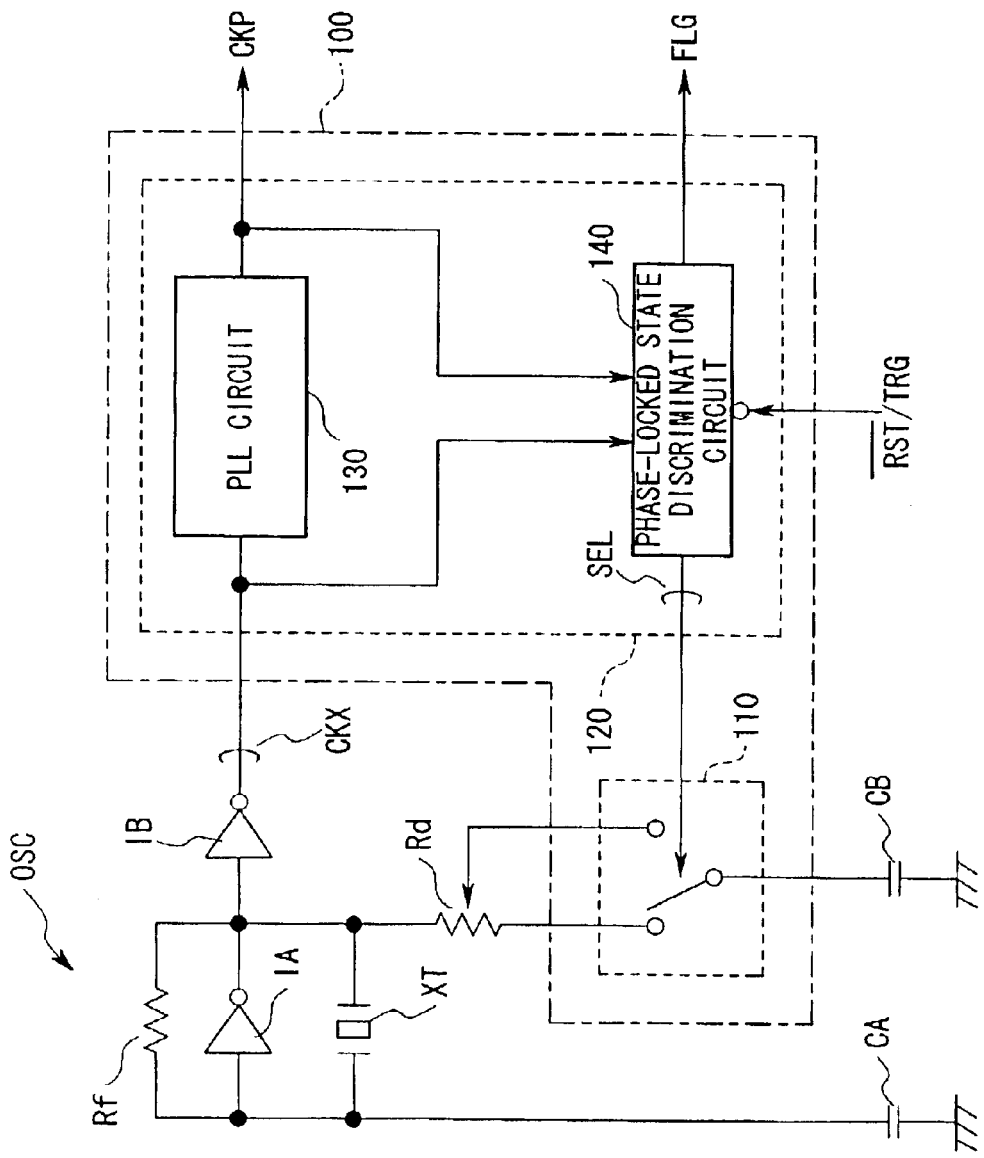
FIG. 1 is a circuit diagram including blocks showing an oscillation control circuit adapted to an oscillation circuit in accordance with a first embodiment of the invention.

This invention will be described in further detail by way of examples with reference to the accompanying drawings.
1. First Embodiment FIG. 1 is a circuit diagram including circuit blocks in which an oscillation control circuit is adapted to an oscillation circuit in accordance with a first embodiment of the invention. That is, an oscillation control circuit 100 controls an oscillation state of an oscillation circuit OSC by switching over a damping resistance Rd, wherein it comprises a switch 110 and an oscillation state discrimination circuit 120, which further comprises a PLL (Phase-Locked Loop) circuit 130 and a phase-locked state discrimination circuit 140. The configuration of the oscillation circuit OSC shown in FIG. 1 is basically identical to that of the aforementioned oscillation circuit shown in FIG. 13, wherein parts identical to those shown in FIG. 13 are designated by the same reference numerals; hence, the detailed description thereof will be omitted as necessary, whereas the switch 110 corresponding to the aforementioned switch SW is used as a constituent element of the oscillation control circuit 100.

In FIG. 1, the switch 110 switches over the damping resistance Rd, which is adequately changed over between an original resistance, which should be set under a stable condition of oscillation, and a small resistance that is set to stabilize oscillation in an initial period. The PLL circuit 130 multiplies the frequency of an oscillation signal CKX output from the oscillation circuit OSC, thus producing a clock signal CKP. Herein, the clock signal CKP is controlled in phase in synchronization with the oscillation signal CKX. In the first embodiment, the PLL circuit 130 doubles the frequency of the oscillation signal CKX to produce the clock signal CKP.

The phase-locked state discrimination circuit 140 makes a decision as to whether or not the PLL circuit 130 is placed in a phase-locked state, on the basis of a phase relationship between the oscillation signal CKX output from the oscillation circuit OSC and the clock signal CKP produced by the PLL circuit 130. Based on a decision result, the phase-locked state discrimination circuit 140 switches over the contact of the switch 110.

The internal configuration of the phase-locked state discrimination circuit 140 will be described with reference to FIG. 2. The phase-locked state discrimination circuit 140 comprises a shift register 141 for inputting the oscillation signal CKX based on the clock signal CKP, an exclusive-or circuit 142 that functions as a decode circuit, and other circuit elements that may construct a signal generation circuit.

Specifically, the shift register 141 sequentially stores 2-bit signals that are consecutively input thereto in a time-series manner, wherein a data input terminal thereof receives the oscillation signal CKX output from the oscillation circuit OSC, and a clock input terminal thereof receives the clock signal CKP output from the PLL circuit 130. 2-bit signals stored in the shift register 141 are sequentially supplied to the exclusive-or circuit 142.

The clock signal CKP is delivered to input terminals of timers 143 and 144 respectively, wherein an output terminal of the timer 143 is connected to a set terminal (S) of the timer 144, an output terminal of which is connected with an input terminal of an inverter 145 and a clock terminal of a D flip-flop (D-FF) 147. In addition, an output terminal of the exclusive-or circuit 142 is connected to a reset terminal (R) of an RS flip-flip 146, and an output terminal of the inverter 145 is connected to a set terminal (S) of the RS flip-flop 146. An output terminal of the RS flip-flop 146 is connected to a data input terminal (D) of the D flip-flop 147, which in turn outputs a signal FLG to a clock terminal of a D flip-flop 148. A data input terminal (D) of the D flip-flop 148 is fixedly connected with a power supply (or a voltage supply). An output signal (SEL) of the D flip-flop 148 is used to switch over the contact of the switch 110.

The aforementioned circuit elements, that is, the timers 143 and 144, inverter 145, RS flip-flop 146, and D flip-flops 147 and 148, are combined together to construct the aforementioned signal generation circuit that produces the signal SEL for switching over the damping resistance Rd based on the output signal of the exclusive-or circuit 142. Herein, the timers 143 and 144 construct a timer circuit that measures a prescribed time period based on the clock signal CKP output from the PLL circuit 130. In addition, the inverter 145, RS flip-flop 146, and D flip-flops 147 and 148 construct an order circuit for producing the signal SEL under the condition where the exclusive-or circuit 142 inputs a prescribed combination of logical values during the prescribed time period measured by the aforementioned timer circuit.

Incidentally, a control signal $\overline{\text{RST}}$/TRG is generated by an internal circuit of a system (not shown) comprising the oscillation circuit OSC upon detection of supply voltage applied thereto, wherein it may be named a power-on reset signal, for example. The control signal $\overline{\text{RST}}$/TRG is supplied to the timer 143 as a trigger signal, and it is also supplied to the timer 144 as a reset signal. In addition, the control signal $\overline{\text{RST}}$/TRG is also supplied to reset terminals (R) of the RS flip-flop 146 and D flip-flop 148 respectively. The timer 143 outputs a high level when reset; then, it outputs a low level (namely, a signal CKTB) after completely counting a prescribed number of pulses of the clock signal CKP. The timer 144 outputs a low level when reset, wherein after a low level is applied to the set terminal, it outputs a high level each time when a prescribed number of pulses of the clock signal CKP is counted.

Figure 3:
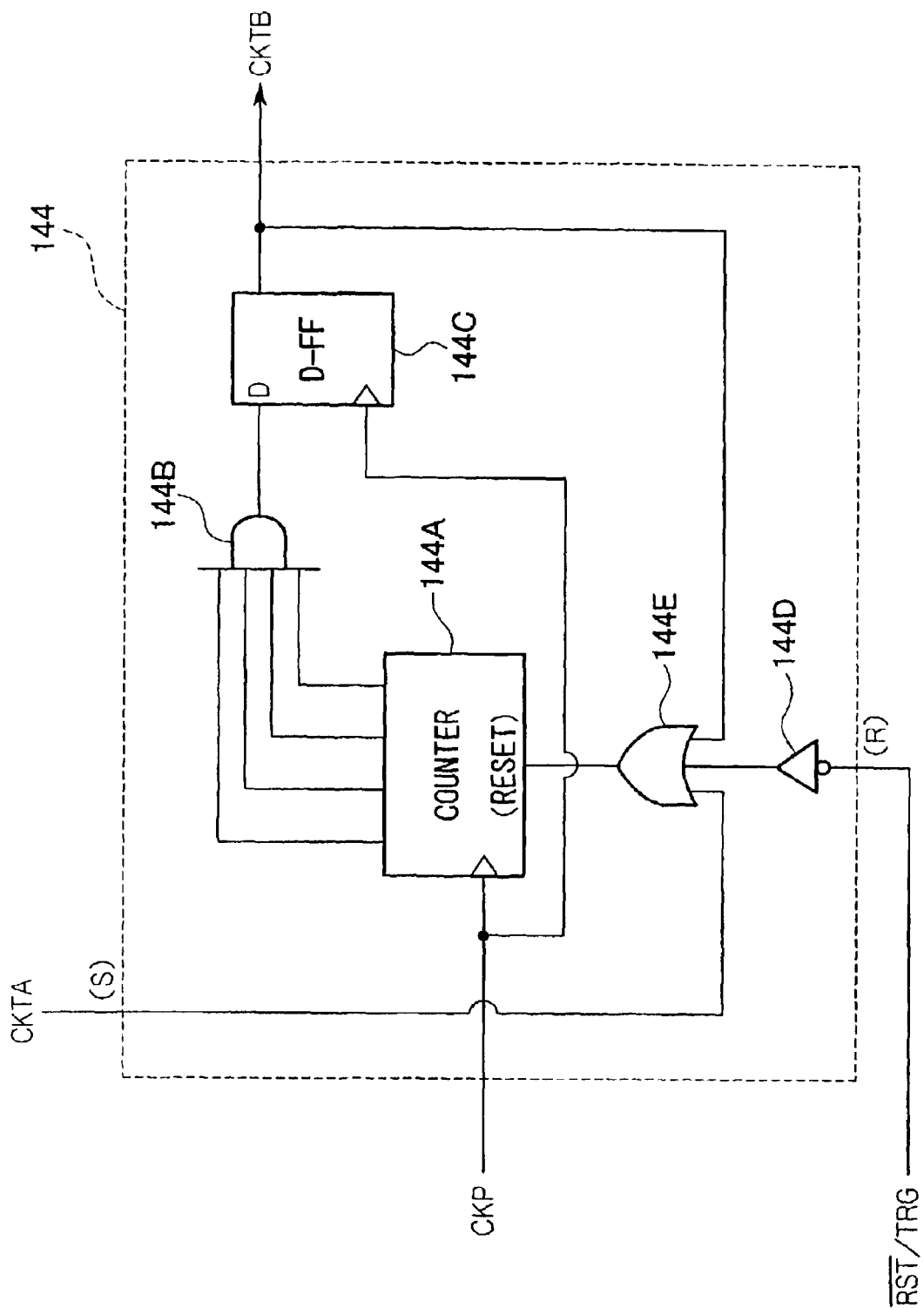
FIG. 3 is a circuit diagram including blocks showing an example of the internal configuration of a timer shown in FIG. 2.

The internal configuration of the timer 144 will be described with reference to FIG. 3, wherein the timer 144 comprises a 4-bit counter 144A, an AND circuit 144B, a D flip-flop 144C, a buffer 144D having a negated input, and an OR circuit 144E. Herein, the clock signal CKP is input to a clock terminal of the 4-bit counter 144A, and a reset terminal of the 4-bit counter 144A receives the aforementioned control signal $\overline{\text{RST}}$/TRG via the buffer 144D and the OR circuit 144E. Four output terminals (corresponding to four bits respectively) of the 4-bit counter 144A are all connected with four input terminals of the AND circuit 144B, an output terminal of which is connected to a data input terminal (D) of the D flip-flop 144C. The clock signal CKP is supplied to a clock terminal of the D flip-flop 144C, which outputs a signal CKTB. The output signal CKTB of the D flip-flop 144C and the output signal CKTA of the timer 143 are supplied to input terminals of the OR circuit 144E.

In the timer 144, the 4-bit counter 144A counts pulses of the clock signal CKP to produce a 4-bit signal consisting of four bits, whereby the output of the AND circuit 144B becomes high when all bits are '1'. At a leading-edge timing of the clock signal CKP just after the output of the AND circuit 144B becomes high, the D flip-flop 144C outputs a signal CKTB having a high level. That is, the timer 144 measures time in such a way that when the 4-bit counter 144A completely counts fifteen pulses of the clock signal CKP, the signal CKTB becomes high.

Next, the overall operation of the aforementioned circuits shown in FIGS. 1 and 2 will be described in detail with reference to time charts shown in FIGS. 4A–4F and FIGS. 5A–5F.

In an initial state, the control signal $\overline{\text{RST}}$/TRG is set to a low level, so that the timer 144, RS flip-flop 146, and D flip-flops 147 and 148 are all placed in a set state. In such an initial state, the contact of the switch 110 is set to switch over the damping resistance Rd to a small resistance. When supply voltage is applied to the system (not shown) at time t0, the control signal $\overline{\text{RST}}$/TRG becomes high (see FIG. 4A) to activate the oscillation control circuit 100, which thus operates to perform a series of operations to switch over the switch 110, details of which will be described below.

At time t0 when supply voltage is applied to the system, the oscillation circuit OSC is placed in an initial state where the damping resistance Rd is reduced to a small resistance, wherein the oscillation circuit OSC releases suppression of an excitation level applied to the quartz oscillator XT so as to rapidly start oscillation.

Then, the supply voltage gradually increases in level to become greater than a prescribed level at which the gain of the inverter IA becomes greater than the loss of the quartz oscillator XT. At this time, the oscillation circuit OSC actually starts oscillation so that the inverter IB outputs an oscillation signal CKX, which is supplied to the oscillation control circuit 100 to discriminate whether or not oscillation is certainly established. Based on a discrimination result, the switch 110 switches over the contact thereof so as to restore the damping resistance Rd to an original resistance.

The aforementioned discrimination made by the oscillation control circuit 100 will be described in detail. When the oscillation circuit OSC performs oscillation to output an oscillation signal CKX, the PLL circuit 130 of the oscillation control circuit 100 doubles the frequency of the oscillation signal CKX, thus producing a clock signal CKP in synchronization with the oscillation signal CKX. Herein, the PLL circuit 130 performs feedback controls so as to conform the clock signal CKP with the oscillation signal CKX in phase, so that the phase of the clock signal CKP will completely match the phase of the oscillation signal CKX. Based on a phase relationship between the oscillation signal CKX and clock signal CKP, the phase-locked state discrimination circuit 140 discriminates whether or not the PLL circuit 130 is placed in a phase-locked state, in other words, it makes a decision as to whether or not the clock signal CKP synchronizes with the oscillation signal CKX.

Next, a description will be given with respect to the operating principle of the phase-locked state discrimination circuit 140, that is, the operating principle for discriminating a phase-clocked state based on a phase relationship between the oscillation signal CKX and clock signal CKP.

In general, the feedback system of the PLL circuit 130 has a finite response speed, which may be accompanied with a certain delay in response. Therefore, when the frequency of the oscillation signal CKX varies, the frequency of the clock signal CKP correspondingly varies to follow up with a variation of the frequency of the oscillation signal CKX with a certain delay. That is, when the oscillation circuit OSC performs oscillation in an unstable manner, the PLL circuit 130 is difficult to be placed in a phase-locked state, so that the clock signal CKP does not synchronize the oscillation signal CKX. This causes a phase deviation between the oscillation signal CKX and clock signal CKP, which do not match each other in phase.

In contrast, when the oscillation circuit OSC performs oscillation in a stable manner, the PLL circuit 130 is placed in a phase-locked state, so that the clock signal CKP synchronizes with the oscillation signal CKX. That is, the phase of the clock signal CKP matches the phase of the oscillation signal CKX, so that a certain phase relationship is established between these signals. This indicates that based on a phase relationship between the oscillation signal CKX and clock signal CKP, it is possible to precisely discriminate whether or not the PLL circuit 130 is placed in a phase-locked state, in other words, it is possible to precisely determine whether or not the oscillation circuit OSC performs oscillation in a stable manner.

FIGS. 5A to 5F show examples of phase relationships each established between the oscillation signal CKX and the clock signal CKP.

FIGS. 5A and 5B shows an example of the phase relationship in which the clock signal CKP having the double frequency of the oscillation signal CKX is synchronized with the oscillation signal CKX. In this example, the oscillation signal CKX is alternatively changed over in level between '1' and '0' at leading edges of pulses of the clock signal CKP respectively, wherein the PLL circuit 130 is placed in a phase-locked state.

FIGS. 5C and 5D shows an example of the phase relationship in which the PLL circuit 130 is not placed in a phase-locked state so that the clock signal CKP is not synchronized with the oscillation signal CKX. Specifically, this example shows that the frequency of the clock signal CKP is increased to be greater than double the frequency of the oscillation signal CKX. FIGS. 5E and 5F shows an example of the phase relationship in which the clock signal CKP is not synchronized with the oscillation signal CKX, wherein the frequency of the clock signal CKP is decreased to be less than double the frequency of the oscillation signal CKX. As shown in FIGS. 5C to 5F, when the clock signal CKP is not synchronized with the oscillation signal CKX, the oscillation signal CKX is not periodically changed over in level between '1' and '0' at leading edges of pulses of the clock signal CKX, wherein logic '1' or logic '0' consecutively occur in the oscillation signal CKP at leading edges of pulses of the clock signal CKP.

As described above, combinations of logical values of the oscillation signal CKX at leading edges of pulses of the clock signal CKP depend on the phase relationship between the oscillation signal CKX and clock signal CKP; therefore, it is possible to detect whether or not the PLL circuit 130 is placed in a phase-locked state on the basis of combinations of logical values. The first embodiment determines that the oscillation circuit OSC performs oscillation in a stable manner when logic '1' and logic '0' (or logic '0' and logic '1') sequentially emerge in the oscillation signal CKX at leading edges of two consecutive pulses of the clock signal CKP in a time-series manner. In contrast, it is determined that the oscillation circuit OSC performs oscillation in an unstable manner when the same logic '1' (or same logic '0') sequentially emerge in the oscillation signal CKX at leading edges of two consecutive pulses of the clock signal CKP. That is, the first embodiment uses a combination of logic '1' and logic '0' (or a combination of logic '0' and logic '1') as the basis for determination as to whether or not the oscillation circuit OSC performs oscillation in a stable manner.

With reference to FIGS. 5A to 5F, the operating principle is described in such a way that the oscillation state of the oscillation circuit OSC is discriminated based on logical values of the oscillation signal CKX detected at leading edges of pulses of the clock signal CKP. Of course, the operating principle can be changed in such a way that the oscillation state is discriminated based on logical values of the oscillation signal CKX detected at trailing edges of pulses of the clock signal CKP.

Figure 2:
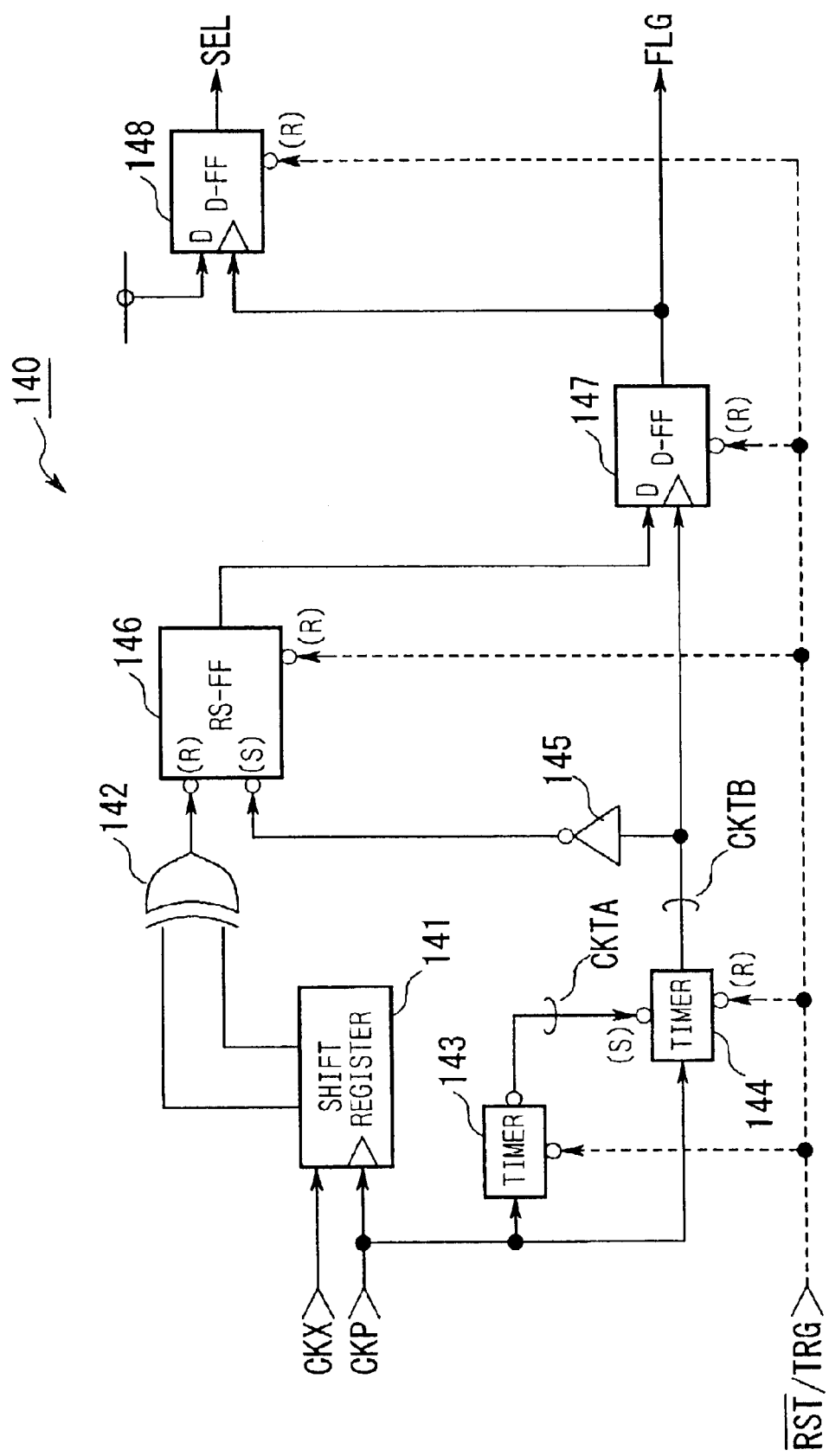
FIG. 2 is a block diagram including logical circuits showing the internal configuration of a phase-locked state discrimination circuit shown in FIG. 1.

Next, a description is given with respect to the operation of the phase-locked state discrimination circuit 140 of FIG. 2, which operates based on combinations of logical values of the oscillation signal CKX supplied to the shift register 141 in connection with the clock signal CKP.

That is, the phase-locked state discrimination circuit 140 basically operates in such a way that the oscillation state of the oscillation circuit OSC is discriminated by the shift register 141 and the exclusive-or circuit 142 based on the oscillation signal CKX and clock signal CKP. Specifically, the shift register 141 sequentially inputs logical values of the oscillation signal CKX at leading edges of consecutive pulses of the clock signal CKP in a time-series manner, thus retaining 2-bit signals. The exclusive-or circuit 142 performs exclusive-or operations on 2-bit signals output from the shift register 141. Herein, when a 2-bit signal matches a prescribed combination of logical values, specifically, when it consists of digits '1' and '0' (or digits '0' and '1'), the exclusive-or circuit 142 outputs logic '1'. In contrast, when a 2-bit signal consists of the same digit '1' (or the same digit '0'), the exclusive-or circuit 142 outputs logic '0'. As described above, the exclusive-or circuit 142 outputs logic '1' when the clock signal CKP is synchronized with the oscillation signal CKX, while it outputs logic '0' when the clock signal CKP is not synchronized with the oscillation signal CKX. The output of the exclusive-or circuit 142 is a signal representing a discrimination result as to whether or not the PLL circuit 130 is placed in a phase-locked state (in other words, whether or not the oscillation circuit OSC performs oscillation in a stable manner), wherein it is supplied to the reset terminal (R) (i.e., negated input) of the RS flip-flop 146.

In parallel with the aforementioned phase-locked state discrimination operation, at time t0 when supply voltage is applied to the system (not shown) comprising the oscillation circuit OSC, the internal circuit of the system detects the supply voltage to output a control signal $\overline{\text{RST}}$/TRG having a high level, which is supplied to the timer 143 as a trigger to start time measurement, thus outputting a signal CKTA having a high level during a prescribed time period (namely, a first time period) between time t0 and time t1. The timer 144 is set by the signal CKTA (see FIG. 4B) so that time measurement thereof is inhibited during the prescribed time period between time t0 and time t1. At time t1, the timer 144 starts time measurement to produce a signal CKTB (see FIG. 4D) consisting of pulses P, which periodically emerge as time elapses. The signal CKTB is inverted by the inverter 145 and is then supplied to the set terminal (i.e., negated input) of the RS flip-flop 146.

The RS flip-flop 146 is periodically set by the output signal CKTB of the timer 144 that is supplied thereto via the inverter 145, while it is irregularly (or non-periodically) reset by the output signal of the exclusive-or circuit 142. That is, the oscillation circuit OSC cannot perform oscillation in a stable manner in an initial state; therefore, the exclusive-or circuit 142 retains the output signal thereof at logic '0' so that the RS flip-flop 146 is fixedly placed in a reset state. Thereafter, oscillation is stabilized so that the exclusive-or circuit 142 changes over the output signal thereof and retains it at logic '1'. Therefore, the RS flip-flop 146 is not reset any more and is fixedly placed and maintained in a set state.

In summary, the RS flip-flop 146 is initially placed in a reset state until oscillation of the oscillation circuit OSC is stabilized; then, when the oscillation is stabilized, the RS flip-flop 146 is changed over into a set state in response to a signal CKTB output from the timer 144. As shown in FIG. 4B, the oscillation circuit OSC initially performs oscillation in an unstable manner, wherein oscillation is gradually stabilized during a time period between time t1 and t2, so that the oscillation signal CKX will be stabilized in oscillation frequency and amplitude. FIG. 4B shows that after oscillation is stabilized, it becomes temporarily unstable about time t3, wherein such a temporary unstable state of oscillation will be described later.

In response to the signal CKTB output from the timer 144, the D flip-flop 147 inputs the output signal of the RS flip-flop 146. That is, both the timing at which the RS flip-flop 146 is set and the timing at which the D flip-flop 147 inputs the output signal of the RS flip-flop 146 are defined by the same signal CKTB; therefore, these timings substantially match each other. In short, the D flip-flop 147 inputs the output signal of the RS flip-flop 146 just before being set.

FIGS. 4B and 4D show that oscillation has been already stabilized at a time (prior to time t2) when a first pulse P emerges in the signal CKTB, whereas the RS flip-flop 146 is still placed in a reset state before time t2, so that the D flip-flop 147 does not output a signal FLG (see FIG. 4E). At a leading edge of a second pulse of the signal CKTB (which matches time t2), the D flip-flop 147 inputs the output signal of the RS flip-flop 146 representing that oscillation of the oscillation circuit OSC is stabilized, in other words, representing that the PLL circuit 130 is placed in a phase-locked state, so that it outputs the signal FLG (i.e., a pulse shown in FIG. 4E). This signal FLG is sequentially renewed every time the D flip-flop 147 inputs the output signal of the RS flip-flop 146 in response to the signal CKTB. The signal FLG output from the D flip-flop 147 is supplied to the clock terminal of the D flip-flop 148, which in turns outputs a signal SEL having a high level (which substantially matches supply voltage, see FIG. 4F).

Suppose that a temporarily unstable state of oscillation occurs on the oscillation circuit OSC about time t3 due to some cause. In this case, the D flip-flop 147 inputs the output signal of the RS flip-flop 146 representing that oscillation becomes unstable at time t3, so that the D flip-flop 147 outputs the signal FLG having a low level. However, the data input terminal (D) of the D flip-flop 148 is fixedly connected with the power supply, so that once the signal SEL becomes high at time t2 (see FIG. 4F), the signal SEL is maintained at a high level until the control signal $\overline{\text{RST}}$/TRG is supplied to the reset terminal (R) of the D flip-flop 148 even though oscillation becomes unstable.

Thereafter, when oscillation of the oscillation circuit OSC is stabilized again, the D flip-flop 147 inputs the output signal of the RS flip-flop 146 representing that oscillation is stabilized at a leading edge of a pulse P of the signal CKTB, so that the signal FLG is restored to a high level at time t4.

As described above, the phase-locked state discrimination circuit 140 discriminates whether or not the oscillation circuit OSC performs oscillation in a stable manner based on the phase relationship between the oscillation signal CKX output from the oscillation circuit OSC and the clock signal CKP output from the PLL circuit 130, so that it produces and outputs the signal SEL to the switch 110, which is thus switched over.

In summary, the oscillation control circuit 100 controls the contact of the switch 110 to reduce the damping resistance Rd in an initial state of oscillation of the oscillation circuit OSC, so that oscillation can be rapidly stabilized after applying supply voltage to the system including the oscillation circuit OSC. In a process in which oscillation is caused by the oscillation circuit OSC and is then stabilized, the oscillation control circuit 100 uses characteristics of the PLL circuit 130 to successively discriminate the oscillation state of the oscillation circuit OSC, wherein when it is discriminated that the oscillation is certainly stabilized, the oscillation control circuit 100 switches over the damping resistance Rd to original resistance.

2. Second Embodiment

Next, a second embodiment will be described in detail, wherein the second embodiment is basically similar to the first embodiment except that the phase-locked state discrimination circuit 140 shown in FIGS. 1 and 2 is replaced with a discrimination circuit 150 shown in FIG. 6. Compared with the phase-locked state discrimination circuit 140 of FIG. 2, the discrimination circuit 150 of FIG. 6 further comprises a timer 151 and a NOR circuit 152 (having negated inputs), wherein parts identical to those shown in FIG. 2 are designated by the same reference numerals, and the description thereof will be omitted as necessary. Specifically, the aforementioned signal CKTB output from the timer 144 is supplied to a clock terminal of the timer 151, an output terminal of which is connected to the clock terminal of the D flip-flop 148. In addition, the aforementioned signal FLG output from the D flip-flop 147 is supplied to a first input terminal of the NOR circuit 152, the aforementioned control signal $\overline{\text{RST}}$/TRG is supplied to a second input terminal. An output signal of the NOR circuit 152 is used as a reset signal for the timer 151.

The overall operation of the second embodiment will be described with reference to FIGS. 7A to 7G.

The second embodiment differs from the first embodiment in that the first embodiment outputs a signal SEL at the timing at which oscillation is discriminated to be stable at first, while the second embodiment outputs a signal SEL when oscillation is continuously stabilized during a prescribed time period measured by the timer 151.

In an initial state, the timer 151 is reset by the control signal $\overline{\text{RST}}$/TRG that is supplied thereto via the NOR circuit 152, and the D flip-flop 148 is also reset by the control signal $\overline{\text{RST}}$/TRG. Therefore, the D flip-flop 148 outputs a signal SEL having a low level (see FIG. 7G) in the initial state. When supply voltage is applied to the system (not shown) including the aforementioned oscillation circuit OSC, which is controlled by the oscillation control circuit 100 comprising the PLL circuit 130 and the discrimination circuit 150 in accordance with the second embodiment, the D flip-flop 147 outputs a signal FLG (see FIG. 7E) similarly to the foregoing first embodiment. The initial operation of the discrimination circuit 150 before the D flip-flop 147 outputs the signal FLG is similar to that of the phase-locked state discrimination circuit 140 shown in FIG. 2; therefore, the following description will be given mainly with respect to operations of the timer 151 and its related circuit elements for producing the signal SEL based on signals CKTB and FLG.

After time t0 when supply voltage is applied to the system so that the oscillation circuit OSC starts oscillation, it is discriminated that oscillation is not initially stabilized until time t2; therefore, the D flip-flop 147 outputs the signal FLG having a low level to the NOR circuit 152, which in turn outputs a reset signal having a low level to the timer 151. At this time, the timer 151 is still maintained in a reset state, which is initially established, so that it outputs a signal CKTC having a low level (see FIG. 7F) to the clock terminal of the D flip-flop 148, which is thus maintained in a reset state to continuously output the signal SEL having a low level.

At time t2 when it is discriminated that oscillation is stabilized, the D flip-flop 147 outputs the signal FGL having a high level (see FIG. 7E) at a leading edge of a first pulse P of the signal CKTB (see FIG. 7D), so that the NOR circuit 152 receiving the signal FLG outputs a reset signal having a high level to the timer 151, which is thus released from the reset state to start time measurement for counting pulses P of the signal CKTB output from the timer 144. Herein, the timer 151 counts 'n' (where 'n' is a natural number) pulses P to measure a prescribed time period, thus outputting the signal CKTC having a high level about time t5 (see FIG. 7F).

At time t3 when a count value CNT of the timer 151 is less than 'n', it is discriminated that oscillation is not stabilized, so that the output signal FLG of the D flip-flop 147, which becomes high at time t2, is reduced to a low level. That is, the NOR circuit 152 outputs a reset signal having a low level to the timer 151, which is thus initialized (or reset), so that the timer 151 performs again time measurement and restarts to count pulses P of the signal CKTB at time t4.

Figure 7:
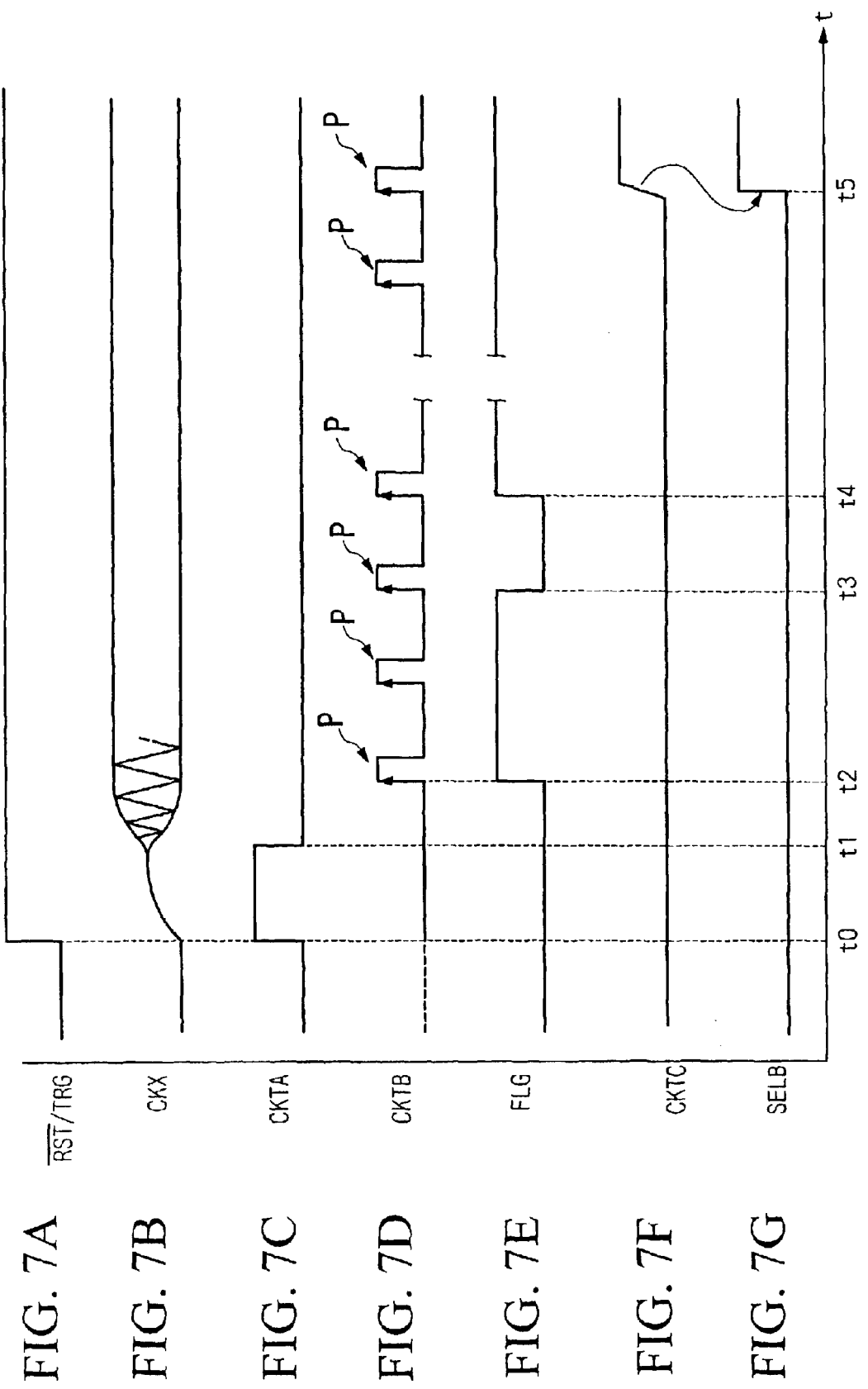
FIG. 7A shows a control signal $\overline{\text{RST}}$/TRG supplied to the discrimination circuit shown in FIG. 6.
FIG. 7B shows an oscillation circuit CKX output from the oscillation circuit OSC shown in FIG. 1.
FIG. 7C shows a signal CKTA output from a timer shown in FIG. 6.
FIG. 7D shows a signal CKTB output from a timer shown in FIG. 6.
FIG. 7E shows a signal FLG output from the discrimination circuit of FIG. 6.
FIG. 7F shows a signal CKTC output from a timer shown in FIG. 6.
FIG. 7G shows a signal SEL output from the discrimination circuit of FIG. 6.

FIGS. 7B and 7E show that oscillation is stabilized again after time t4, so that the output signal FLG of the D flip-flop 147 is maintained at a high level; thereafter, the timer 151 continues counting pulses P of the signal CKTB without being reset. At time t5 when the count number CNT reaches 'n', the timer 151 outputs the signal CKTC having a high level to the D flip-flop 148, which in turn outputs the signal SEL having a high level (see FIG. 7G) to the switch 110, which is thus switched over. Thus, the damping resistance Rd is restored to the original resistance thereof.

According to the second embodiment described above, the timer 151 is introduced to measure a prescribed time period in which oscillation of the oscillation circuit OSC is continuously maintained in a stable manner, so that the damping resistance Rd is restored to the original resistance thereof. That is, the second embodiment is characterized by further improving reliability in discriminating whether or not the oscillation circuit OSC performs oscillation in a stable manner; therefore, it is possible to reliably change over the damping resistance Rd upon precise discrimination of oscillation.

3. Third Embodiment

Next, a third embodiment will be described in detail. In the first and second embodiments, the damping resistance Rd is changed over upon discrimination whether or not the oscillation circuit OSC performs oscillation in a stable manner. The third embodiment is characterized in that a prescribed time period is measured using a timer with respect to the clock signal CKP so as to restore the damping resistance Rd to original resistance, wherein the timer is initialized (or reset) if oscillation is not stabilized so that the timer performs again time measurement.

Figure 6:
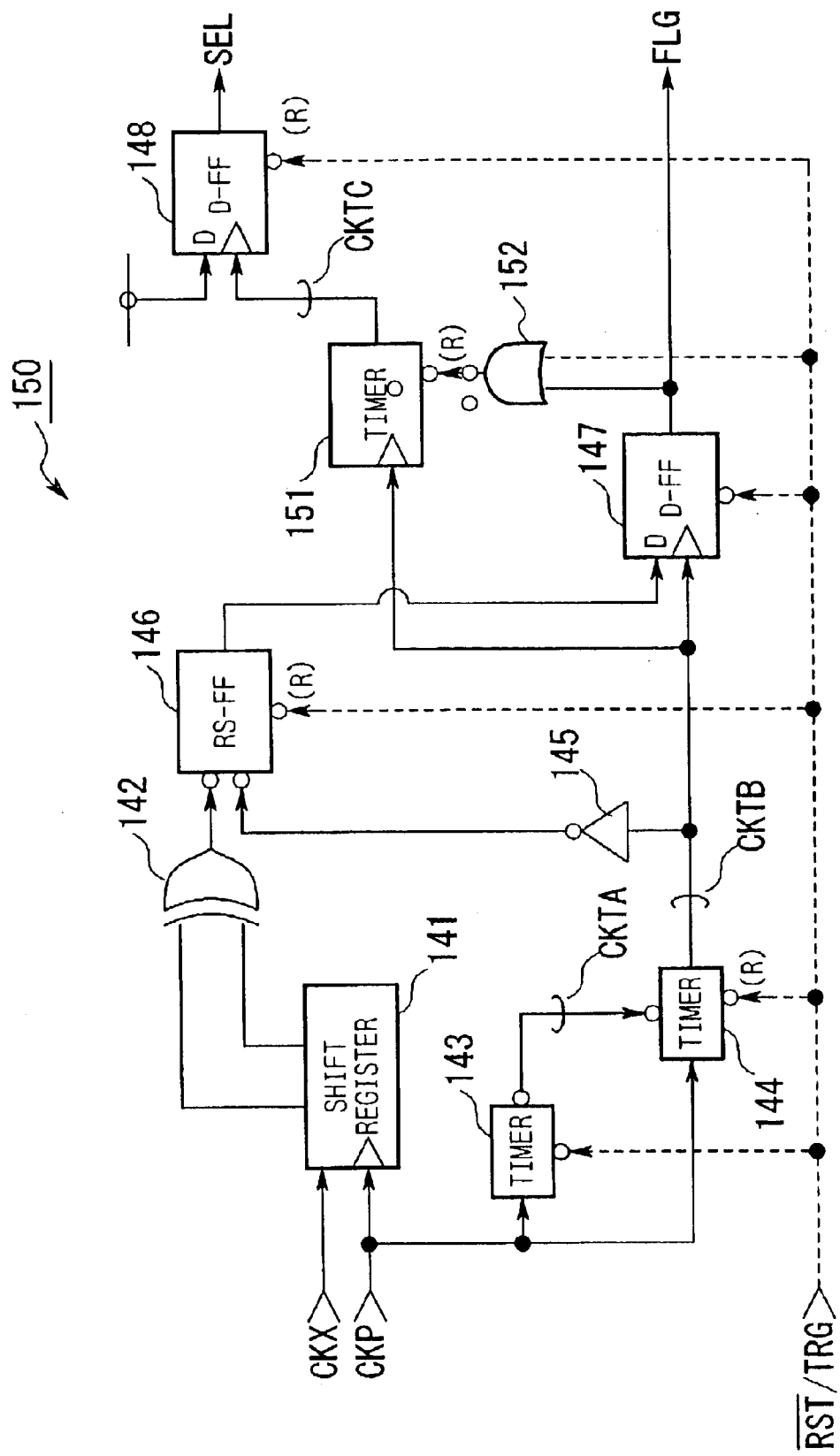
FIG. 6 is a block diagram showing a discrimination circuit adapted to an oscillation control circuit in accordance with a second embodiment of the invention.
Figure 8:
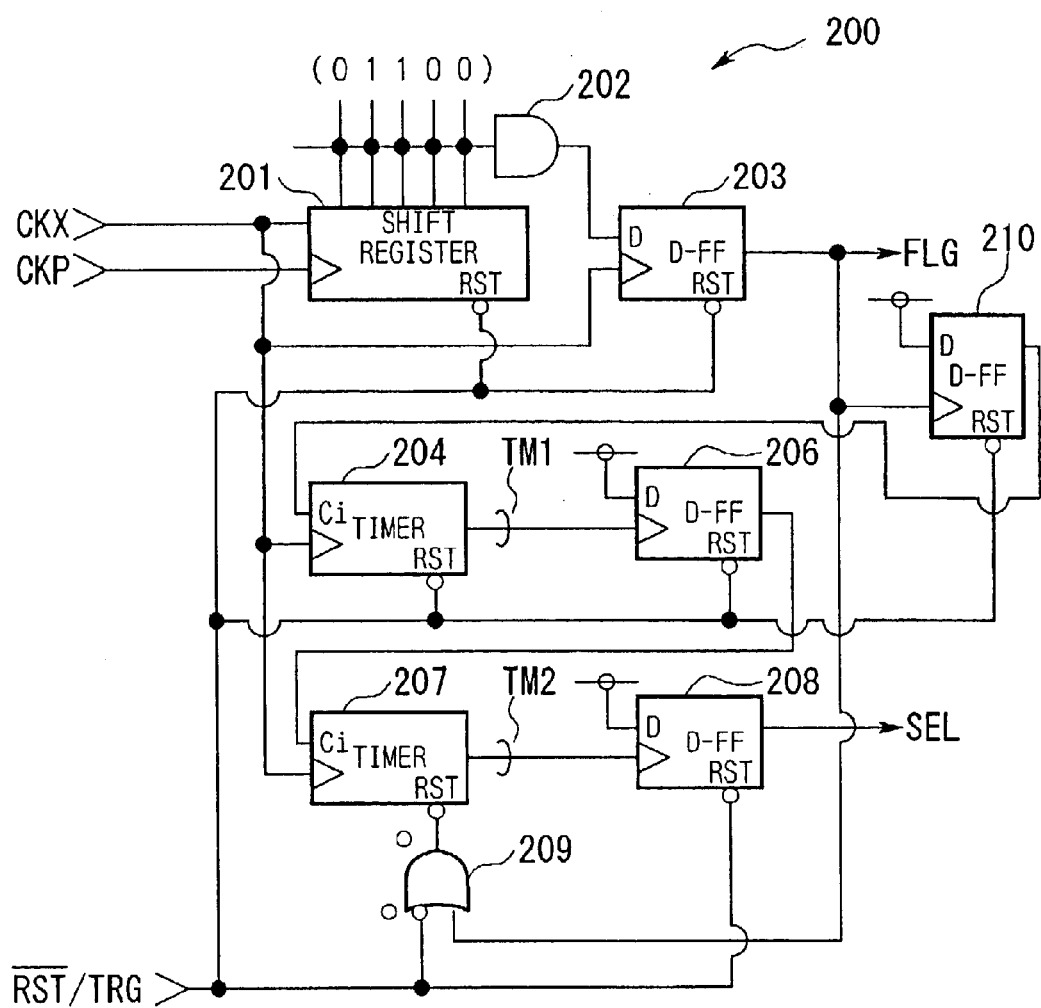
FIG. 8 is a block diagram showing a phase-locked state discrimination circuit adapted to an oscillation control circuit in accordance with a third embodiment of the invention.

The third embodiment is basically similar to the first embodiment except that the phase-locked state discrimination circuit 140 of the oscillation control circuit 100 shown in FIG. 1 is replaced with a phase-locked state discrimination circuit 200 shown in FIG. 8, wherein a shift register 201 and a decode circuit 202 may substantially match the aforementioned shift register 141 and the exclusive-or circuit 142 shown in FIGS. 2 and 6. Compared with the shift register 141, the shift register 201 stores 5-bit signals each consisting of five bits that consecutively emerge in a time-series manner. The decode circuit 202 detects a combination of digits of five bits stored in the shift register 201.

An output terminal of the decode circuit 202 is connected to a data input terminal (D) of a D flip-flop 203, which receives an oscillation signal CKX at a clock terminal. The D flip-flop 203 outputs a signal FLG to a clock terminal of a D flip-flop 210, a data input terminal (D) of which is fixedly connected with a power supply and is fixed at a high level. The oscillation signal CKX is supplied to a clock terminal of a timer 204, a carry terminal (Ci) of which is connected to an output terminal of the D flip-flop 210. An output terminal of the timer 204 is connected to a clock terminal of a D flip-flop 206, a data input terminal (D) of which is fixedly connected with the power supply.

The oscillation signal CKX is also supplied to a clock terminal of a timer 207, a carry terminal (Ci) of which is connected to an output terminal of the D flip-flop 206. An output terminal of the timer 207 is connected to a clock terminal of a D flip-flop 208, a data input terminal (D) of which is fixedly connected with the power supply and is fixed at a high level. The D flip-flop 208 outputs a signal SEL for switching over the contact of the aforementioned switch 110 shown in FIG. 1.

In addition, a NOR circuit 209 (having negated inputs) performs a NOR operation on the aforementioned control signal $\overline{RST}/TRG$ and the signal FLG, both of which are input in negative logic, thus producing a reset signal, which is supplied to a reset terminal (RST) of the timer 207. Furthermore, the control signal $\overline{RST}/TRG$ is directly supplied to all of reset terminals (RST) of the shift register 201, D flip-flop 203, timer 204, and D flip-flops 206, 208, and 210 as reset signals.

Next, the overall operation of the third embodiment will be described in detail with reference to FIGS. 9A to 9G.

Figure 9:
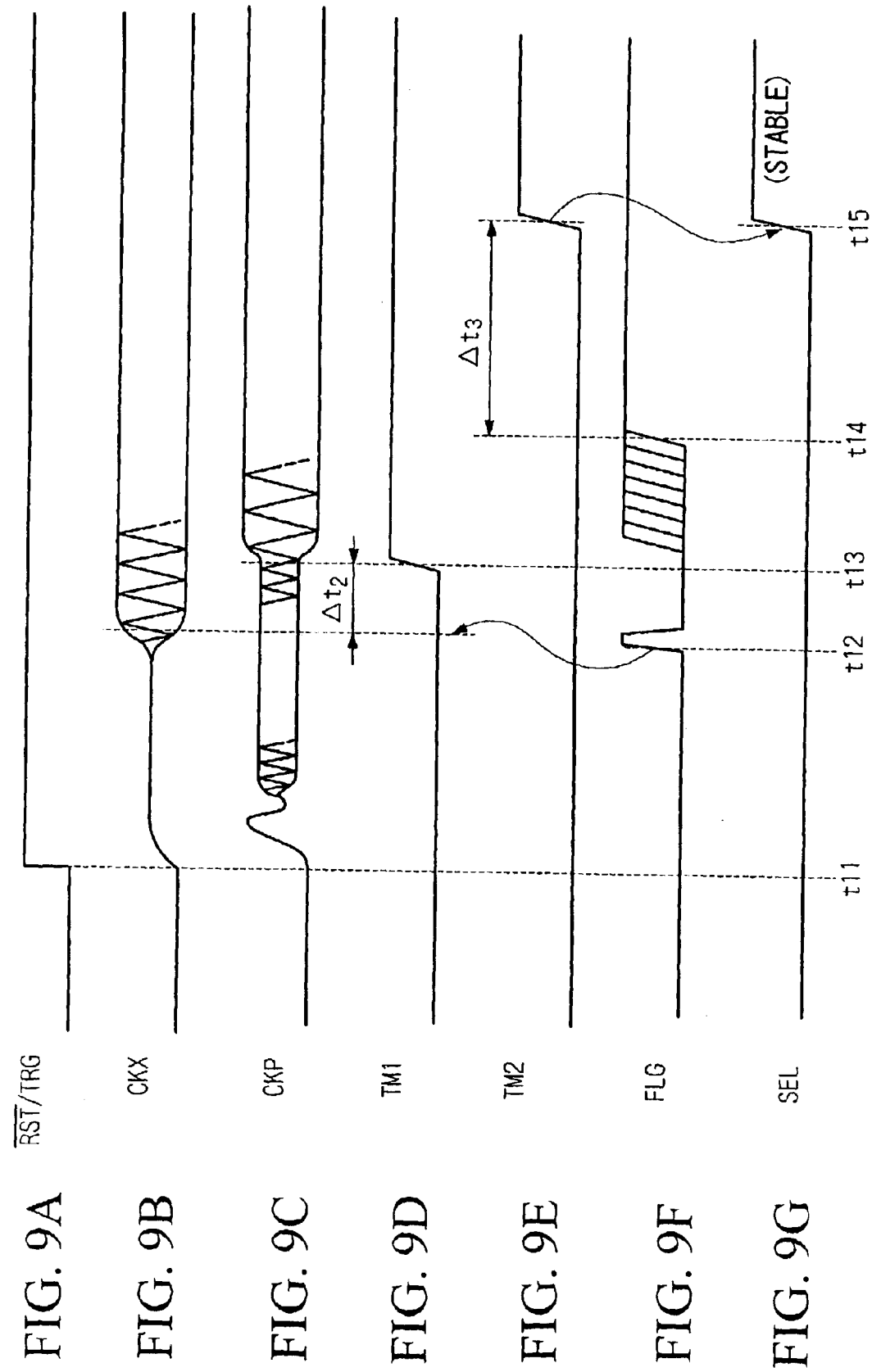
FIG. 9A shows a control signal $\overline{\text{RST}}$/TRG supplied to the phase-locked state discrimination circuit of FIG. 8.
FIG. 9B shows an oscillation circuit CKX output from the oscillation circuit OSC shown in FIG. 1.
FIG. 9C shows a clock signal CKP produced by the PLL circuit based on the oscillation signal CKX.
FIG. 9D shows a signal TM1 output from a timer shown in FIG. 8.
FIG. 9E shows a signal TM2 output from a timer shown in FIG. 8.
FIG. 9F shows a signal FLG output from the phase-locked state discrimination circuit of FIG. 8.
FIG. 9G shows a signal SEL output from the phase-locked state discrimination circuit of FIG. 8 to switch over the switch shown in FIG. 1.

At time t11 when supply voltage is applied to the system (not shown) that includes the oscillation circuit OSC controlled by the oscillation control circuit 100 including the phase-locked state discrimination circuit 200 of FIG. 8, the oscillation signal CKX (see FIG. 9B) of the oscillation circuit OSC gradually increases in level to initially start oscillation in an unstable manner. Under an unstable state of oscillation, however, there may be a possibility that the oscillation signal CKX may be temporarily synchronized with the clock signal CKP. FIGS. 9B and 9C show that the oscillation signal CKX is temporarily synchronized with the clock signal CKP about time t12, so that the output signal of the decode circuit 202 represents that oscillation is stabilized. At this time, the D flip-flop 203 inputs the output signal of the decode circuit 203 in response to the oscillation signal CKX, so that it temporarily outputs the signal FLG having a high level (see FIG. 9F) at time t12. After time t12, there occur events in which the clock signal CKP is temporarily synchronized with the oscillation signal CKX until oscillation becomes certainly stabilized, so that the signal FLG becomes temporarily and repeatedly high as shown in FIG. 9F.

At time 12 when the signal FLG becomes temporarily high, it acts as a trigger for the D flip-flop 210 to directly output a high-level signal corresponding to the power supply applied to the data input terminal thereof. The timer 204 is triggered by the high-level output of the D flip-flop 210 to start counting based on the oscillation signal CKX. At time t13 when the timer 204 completely counts a prescribed number based on the oscillation signal CKX, the timer 204 outputs a signal TM1 having a high level (see FIG. 9D). That is, the timer 204 measures a prescribed time period Δt2 between time t12, at which synchronization between the oscillation signal CKX and clock signal CKP is firstly detected, and time t13, so that the timer outputs the signal TM1 having a high level to the clock terminal of the D flip-flop 206 at time t13. Upon receipt of the signal TM1, the D flip-flop 206 directly outputs a high-level signal corresponding to the power supply applied to the data input terminal thereof. In addition, the timer 207 is triggered by the output signal of the D flip-flop 206 to start time measurement based on the oscillation signal CKX. At this time, when oscillation of the oscillation circuit OSC is not stabilized, the signal FLG cannot be definitely placed in a high level, wherein the timer 207 must be reset every time oscillation becomes unstable, in other words, every time the signal FLG input thereto via the NOR circuit 209 becomes low, so that the timer 207 must restart time measurement.

At time t14 when oscillation becomes certainly stabilized so that the signal FLG is definitely placed in a high level, the timer 207 measures a prescribed time period Δt3 based on the oscillation signal CKX, thus producing a signal TM2 having a high level at time t15. The signal TM2 is supplied to the clock terminal of the D flip-flop 208, which in turn outputs a signal SEL having a high level (corresponding to the power supply). After time t15, the signal SEL is sustained in a high level and is used to switch over the switch 110. That is, the damping resistance Rd is restored to the original resistance thereof at time t15.

In summary, the timer 204 starts time measurement based on the oscillation signal CKX in response to the signal FLG, so that the timer 207 is inhibited from performing time measurement during the prescribed time period Δt2 until the timer 204 completes time measurement. That is, it is possible to reliably inhibit the timer 207 from performing time measurement during an extremely unstable state of oscillation of the oscillation circuit OSC; therefore, it is possible to reliably prevent the timer 207 from unnecessarily performing time measurement, which seems to be futile. Then, the timer 207 starts time measurement, wherein if oscillation of the oscillation circuit OSC is not certainly stabilized, the timer 207 is intermittently initialized (or reset) to stop time measurement, so that the timer 207 must restart time measurement. When oscillation is continuously stabilized during the prescribed time period Δt3, the D flip-flop 208 outputs the signal SEL having a high level, by which the contact of the switch 110 is switched over. As described above, in the third embodiment, a discrimination result regarding oscillation of the oscillation circuit OSC is used to initialize the timer 207 to stop time measurement.

4. Fourth Embodiment

Figure 10:
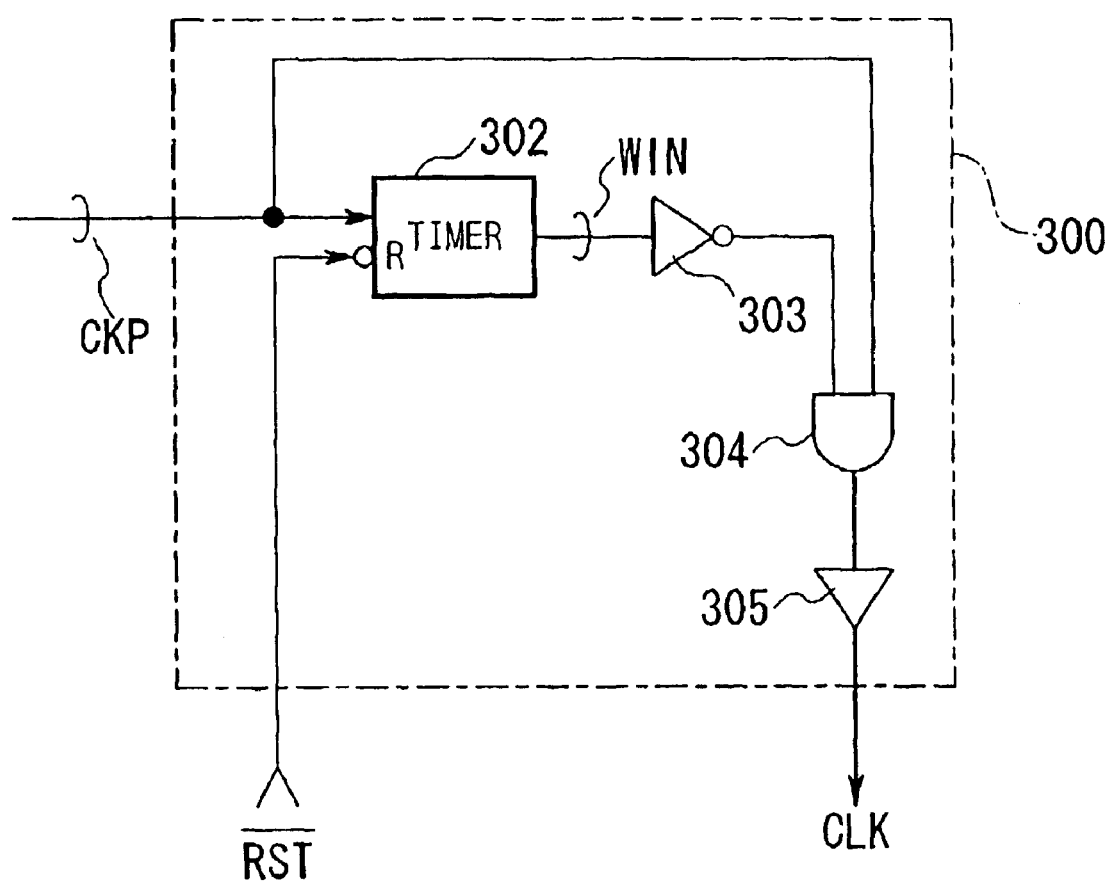
FIG. 10 is a circuit diagram showing an oscillation control circuit adapted to the oscillation circuit shown in FIG. 1 in accordance with a fourth embodiment of the invention.

FIG. 10 shows an oscillation control circuit 300 adapted to the oscillation circuit OSC in accordance with a fourth embodiment of the invention. Each of the first to third embodiments is designed to switch over the damping resistance Rd upon discrimination of the oscillation state of the oscillation circuit OSC. The fourth embodiment is characterized by additionally providing the oscillation control circuit 300, which allows a clock signal to be output therefrom upon elapse of a prescribed time measured by a timer, in addition to the aforementioned configurations of the oscillation circuit OSC and the oscillation control circuit 100 as described in conjunction with the first to third embodiments.

In FIG. 10, the oscillation control circuit 300 comprises a timer 302, an inverter 303, an AND circuit 304, and a buffer 305, wherein a control signal (i.e., a reset signal) $\overline{RST}$ is supplied to a reset terminal (R) of the timer 302 to initialize (or reset) the timer 302, wherein this control signal is produced upon detection of supply voltage applied to the system (not shown) similar to the foregoing control signal $\overline{RST}$/TRG.

The timer 302 measures a prescribed time period based on the clock signal CKP to produce a window signal WIN, which is inverted by the inverter 303 and is then supplied to a first input terminal of the AND circuit 304, a second input terminal of which receives the clock signal CKP. The AND circuit 304 performs AND operation on the inversion of the window signal WIN and the clock signal CKP, thus producing a logical operation result, which is output as a clock signal CLK via the buffer 305. The AND circuit 304 and the buffer 305 function as a gate circuit for blocking transmission of the clock signal CKP therethrough during the prescribed time period measured by the timer 302.

Next, the overall operation of the oscillation control circuit 300 adapted to the oscillation circuit OSC and the oscillation control circuit 100 shown in FIG. 1 will be described in detail with reference to FIGS. 11A to 11E.

Figure 11:
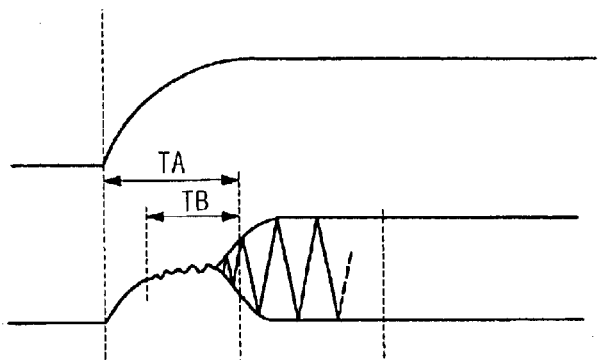
FIG. 11A shows a supply voltage VDD.
FIG. 11B shows an oscillation signal CKX.
FIG. 11C shows a reset signal $\overline{\text{RST}}$ that resets a timer for measuring a prescribed time period used for blocking transmission of a clock signal CKP therethrough in FIG. 10.
FIG. 11D shows a window signal WIN output from the timer shown in FIG. 10.
FIG. 11E shows a clock signal CLK that is output from the oscillation control circuit of FIG. 10.

At time t21 when supply voltage VDD (see FIG. 11A) is applied to the system, it gradually increases in level so that the oscillation circuit OSC starts to perform oscillation to produce an oscillation signal CKX (see FIG. 11B), based on which the PLL circuit 130 outputs a clock signal CKP. In FIGS. 11A and 11B, reference symbol 'TA' represents an unstable state (or an unstable period) of oscillation, and 'TB' represents an unstable period of the clock signal CKP that becomes unstable due to the unstable state of oscillation.

At time t21 for applying supply voltage, the system outputs a reset signal $\overline{RST}$ having a high level (see FIG. 11C) upon detection of the supply voltage applied thereto in parallel with oscillation started by the oscillation circuit OSC. Upon reception of the reset signal, the timer 302 starts time measurement when the clock signal CKP is stabilized to a certain degree, so that the window signal WIN becomes high (see FIG. 11D). The inversion of the window signal WIN is outputted from the inverter 303 and is supplied to the AND circuit 304, so that the clock signal CLK is compulsorily fixed in a low level (see FIG. 11E). That is, the oscillation control circuit 300 blocks the clock signal CKP from being output therefrom as the clock signal CLK.

At time t22 when the timer 302 completes measuring a prescribed time period Δt4, the window signal WIN becomes low, which allows the AND circuit 304 to directly transmit the clock signal CKP therethrough. Thus, the oscillation control circuit 300 directly outputs the clock signal CKP as the clock signal CLK.

According to the fourth embodiment, the clock signal CLK is compulsorily fixed in a low level until the timer 302 completes measuring the prescribed time period Δt4, so that the oscillation control circuit 300 temporarily blocks the clock signal CKP from being output therefrom. Upon elapse of the prescribed time period Δt4, the clock signal CKP is directly output as the clock signal CKP via the AND circuit 304 and the buffer 305. That is, by adequately setting the prescribed time period Δt4 to include the unstable period of oscillation of the oscillation circuit OSC, it is possible to reliably block the clock signal CKP from being output during the unstable period of oscillation. In other words, it is possible to reliably prevent an external device inputting the clock signal CLK (corresponding to the clock signal CKP) from performing abnormal operation due to the unstable state of oscillation.

Figure 12:
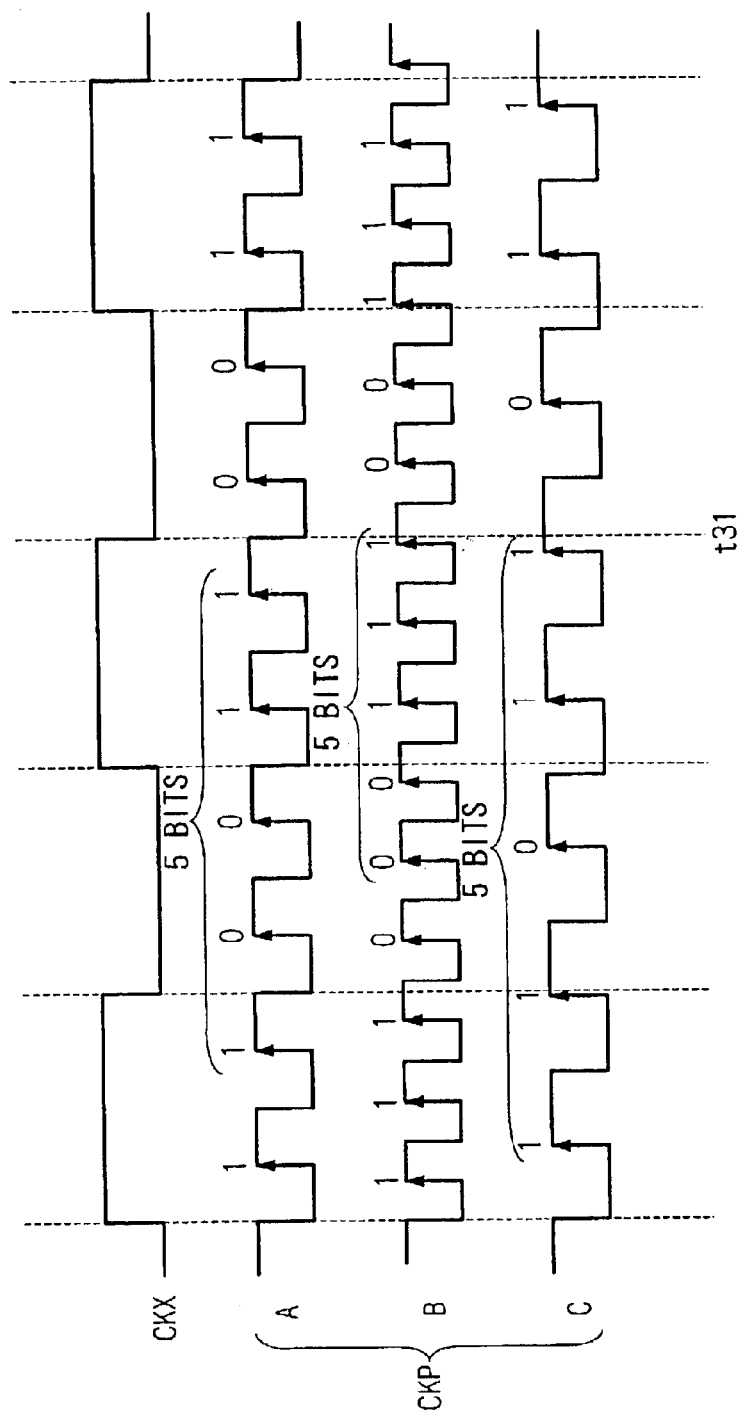
FIG. 12A shows an oscillation signal CKX.
FIG. 12B shows waveform A representing a clock signal CKP that is synchronized with the oscillation signal CKX shown in FIG. 12A.
FIG. 12C shows waveform B representing a clock signal CKP whose frequency is increased in comparison with a multiple of the frequency of the oscillation signal CKX.
FIG. 12D shows waveform C representing a clock signal whose frequency is decreased in comparison with the multiple of the frequency of the oscillation signal CKX.

In each of the first to fourth embodiments, the clock signal CKP is created by doubling the frequency of the oscillation signal CKX in order to discriminate oscillation state of the oscillation circuit OSC, wherein it is possible to set an arbitrary multiple 'N' (which is a natural number not less than '2') for multiplying the frequency of the oscillation signal CKX. FIGS. 12B to 12D show waveforms of the clock signal CKP whose frequency is four times higher than the frequency of the oscillation signal CKX shown in FIG. 12A, wherein the multiple is set to '4'. Herein, waveform A shown in FIG. 12B shows that the clock signal CKP is synchronized with the oscillation signal CKX, while other waveforms B and C shown in FIGS. 12C and 12D show that the clock signal CKP is not synchronized with the oscillation signal CKX. Specifically, the waveform B shows that the frequency of the clock signal CKP is increased higher, in other words, the frequency of the oscillation signal CKX is varied to be decreased in comparison with the clock signal CKP; and the waveform C shows that the frequency of the clock signal CKP is decreased lower, in other words, the frequency of the oscillation signal CKX is varied to be increased in comparison with the clock signal CKP. With respect to the waveform A, a combination of digits of five bits retained in a shift register (e.g., shift register 201 shown in FIG. 8) at time t31 is represented as '11001' counted from the leftmost bit in FIG. 12B. With respect to the waveform B, a combination of digits of five bits retained in the shift register at time t31 is represented as '11100' counted from the leftmost bit in FIG. 12C. With respect to the waveform C, it is represented as '11011' counted from the leftmost bit in FIG. 12D.

It may be understood that in order to discriminate the oscillation state of the oscillation circuit OSC by using a prescribed number of bits (which matches the aforementioned multiple, for example), no variation may occur between combinations of digits of bits retained in the shift register unless the clock signal CKP is deviated in phase from the oscillation signal CKX by one and a half clock cycle, or more. When the oscillation state is discriminated using five bits (the number of which is produced by adding '1' to the multiple '4'), a variation can be caused between combinations each consisting of five bits by introducing only a half clock cycle by which the clock signal CKP differs from the oscillation signal CKX in phase; therefore, it becomes possible to precisely discriminate whether or not the clock signal CKP is synchronized with the oscillation signal CKX. The aforementioned description can be expanded with respect to the multiple 'N'. That is, the shift register is merely required to input a (N+1)-bit signal consisting of (N+1) bits, a combination of which is used for the basis of discrimination as to whether or not CKP is synchronized with CKX. Therefore, the shift register for inputting the oscillation signal CKX based on the clock signal CKP is designed to store (N+1)-bit signals sequentially supplied thereto in a time-series manner. Incidentally, the storage size of the shift register is not necessarily limited to (N+1) bits; therefore, if a satisfactory precision for discrimination can be obtained, it is possible to design the shift register to store 'N' bits, the number of which matches the multiple 'N' used for creation of the clock signal CKP by multiplying the frequency of the oscillation signal CKX.

This invention is not necessarily limited to the aforementioned embodiments; hence, it is possible to modify the embodiments without departing from the scope of the invention. For example, the fourth embodiment is designed in such a way that the oscillation control circuit 300 blocks the clock signal CKP from being output therefrom during the prescribed time period measured by the timer 302. Herein, it is possible to combine the aforementioned discrimination function employed in the first to third embodiments together with the fourth embodiment. In this case, the oscillation state of the oscillation circuit OSC is discriminated similarly to the first to third embodiments; then, the oscillation control circuit 300 of the fourth embodiment allows transmission of the clock signal CKP therethrough as the clock signal CLK.

Specifically, the oscillation control circuit 100 (e.g., PLL circuit 130) employed in the first to third embodiments produces the clock signal CKP to be derived from the output of the oscillation circuit OSC, wherein when the phase-locked state discrimination circuit 140 produces a 'negative' discrimination result, the aforementioned gate circuit (corresponding to the AND circuit 304 and buffer 305) blocks transmission of the clock signal CKP therethrough. That is, the gate circuit is controlled based on the discrimination result of the phase-locked state discrimination circuit 140 and the like, thus blocking or allowing transmission of the clock signal CKP therethrough.

As described heretofore, this invention has a variety of effects and technical features, which will be described below.

(1) An oscillation state discrimination circuit of this invention basically comprises a PLL circuit and a discrimination circuit to discriminate whether or not an oscillation circuit performs oscillation in a stable manner. The PLL circuit produces a clock signal by multiplying the frequency of an oscillation signal output from the oscillation circuit, wherein the clock signal is controlled in phase to be synchronized with the oscillation signal. The discrimination circuit discriminates whether or not the PLL circuit is placed in a phase-locked state on the basis of the phase relationship between the oscillation signal and clock signal.

(2) Due to phase controls, the PLL circuit is certainly placed in a phase-locked state under a stable state of oscillation of the oscillation circuit; therefore, it is possible to maintain a certain phase relationship between the oscillation signal and clock signal. When the PLL circuit is not placed in a phase-locked state, it becomes impossible to maintain a certain phase relationship between the oscillation signal and clock signal. Therefore, it is possible to reliably discriminate whether or not the oscillation circuit performs oscillation in a stable manner upon discrimination whether or not the PLL circuit is certainly placed in a phase-locked state.

(3) An oscillation control circuit of this invention switches over a damping resistance arranged inside of the oscillation circuit so as to control the oscillation state of the oscillation circuit, wherein it comprises the aforementioned PLL circuit and discrimination circuit together with a switch that switches over the damping resistance based on the discrimination result. Herein, when it is discriminated that oscillation of the oscillation circuit is not stabilized, the switch is switched over to temporarily reduce the damping resistance in an initial state of oscillation. When it is discriminated that oscillation is certainly stabilized, the switch is switched over so that the damping resistance is restored to original resistance thereof.

(4) The oscillation control circuit can be modified to additionally provide a gate circuit in addition to the aforementioned PLL circuit and discrimination circuit, wherein the gate circuit blocks transmission of the clock signal therethrough when the discrimination circuit produces a negative discrimination result. That is, when it is discriminated that oscillation of the oscillation circuit is not stabilized, the gate circuit automatically blocks transmission of the clock signal, which is derived from the oscillation signal, therethrough. Therefore, it is possible to reliably prevent an unstable oscillation signal from being unexpectedly output to an external device (such as a system incorporating the oscillation circuit accompanied with the oscillation control circuit); thus, it is possible to reliably prevent the external device from performing abnormal operation.

(5) In the above, the oscillation control circuit comprises a timer for performing time measurement based on the oscillation signal, wherein the gate circuit blocks transmission of the clock signal derived from the oscillation signal therethrough during a prescribed time period that is measured by the timer.

(6) The oscillation control circuit can be modified to include a shift register, a decode circuit, and a signal generation circuit in addition to the aforementioned PLL circuit, which produces the clock signal based on the oscillation signal output from the oscillation circuit. The shift register stores multiple bits sequentially supplied thereto based on the oscillation signal in synchronization with the clock signal. The decode circuit decodes detects a prescribed combination of digits of multiple bits stored in the shift register under the stable state of oscillation of the oscillation circuit. The signal generation circuit generates a signal for switching over the damping resistance based on the output of the decode circuit.

(7) In the above, combinations of digits of bits stored in the shift register depend upon phase relationships each established between the oscillation signal and clock signal. Herein, when the PLL circuit is placed in a phase-locked state, a certain phase relationship can be established between the oscillation signal and clock signal, so that the shift register can store a prescribed combination of digits of bits, which is detected by the decode circuit to activate the signal generation circuit to produce the signal having a prescribed logical value. When the PLL circuit is not placed in a phase-locked state, the prescribed phase relationship cannot be maintained between the oscillation signal and clock signal, so that the shift register cannot store the prescribed combination of digits of bits, which is detected by the decode circuit.

(8) In the above, the oscillation control circuit can be partially modified to provide an order circuit in addition to the aforementioned timer and decode circuit, wherein the order circuit produces a signal having a prescribed level to switch over the damping resistance when the decode circuit detects the prescribed combination of digits of bits. That is, it is possible to reliably switch over the switch upon determination of the stable state of oscillation.

(9) It is possible to further modify the oscillation control circuit in such a way that a first order circuit outputs a signal upon detection of the prescribed combination of digits of bits by the decode circuit, by which a second timer is initialized in time measurement for activating a second order circuit to switch over the damping resistance. Herein, it is possible to detect a temporarily unstable state of oscillation that occurs after oscillation of the oscillation circuit is once stabilized. Therefore, it is possible to adaptively switch over the switch in response to the oscillation state, which may be once stabilized and then temporarily becomes unstable.

(10) The aforementioned order circuit can be modified to activate the timer measuring the prescribed time period only when the prescribed combination of digits of bits is continuously detected during the prescribed time period, so that the switch is certainly switched over to change the damping resistance only when the stable state of oscillation is maintained during the prescribed time period.

(11) The aforementioned PLL circuit can be modified to produce a clock signal whose frequency is 'N' times (where 'N' is a natural number not less than '2') higher than the frequency of the oscillation signal, wherein the aforementioned discrimination circuit discriminates whether or not the PLL circuit is placed in a phase-locked state on the basis of a combination of digits of bits contained in a (N+1)-bit signal, which responds to a phase relationship between the oscillation signal and clock signal.

(12) The aforementioned signal generation circuit can be modified to invalidate the detection result of the decode circuit during elapse of the prescribed time period after the oscillation circuit starts oscillation. Herein, it is possible not to discriminate the oscillation state in an initial state of oscillation in which oscillation is not stabilized. Hence, it is possible to prevent the discrimination circuit from performing discrimination regarding the oscillation state, which may be futile in the initial state of oscillation. Thus, it is possible to reliable perform discrimination in a stable manner.

As this invention may be embodied in several forms without departing from the spirit or essential characteristics thereof, the present embodiment is therefore illustrative and not restrictive, since the scope of the invention is defined by the appended claims rather than by the description preceding them, and all changes that fall within metes and bounds of the claims, or equivalents of such metes and bounds are therefore intended to be embraced by the claims.

What is claimed is:

1. An oscillation state discrimination circuit adapted to an oscillation circuit, comprising:

a PLL circuit for producing a clock signal whose frequency is a multiple of a frequency of an oscillation signal, which is output from the oscillation circuit performing oscillation, wherein the PLL circuit controls the clock signal in phase to be synchronized with the oscillation signal; and a discrimination circuit for discriminating whether or not the PLL circuit is placed in a phase-locked state on the basis of a phase relationship between the oscillation signal and the clock signal, thus discriminating whether or not oscillation of the oscillation circuit is stabilized, wherein the PLL circuit produces the clock signal by increasing the frequency of the oscillation signal with a multiple N (where N is a natural number not less than 2), and wherein the discrimination circuit discriminates whether or not the PLL circuit is placed in a phase-locked state on the basis of a regularity among phase relationships each detected between the oscillation signal and the clock signal with respect to each of N bits.

2. An oscillation control circuit adapted to an oscillation circuit, comprising:

a PLL circuit for producing a clock signal whose frequency is a multiple of a frequency of an oscillation signal, which is output from the oscillation circuit performing oscillation, wherein the PLL circuit controls the clock signal in phase to be synchronized with the oscillation signal;

a discrimination circuit for discriminating whether or not the PLL circuit is placed in a phase-locked state on the basis of a phase relationship between the oscillation signal and the clock signal, thus discriminating whether or not oscillation of the oscillation circuit is stabilized; and a switch for switching over a damping resistance arranged inside of the oscillation circuit in response to a discrimination result, thus controlling an oscillation state of the oscillation circuit.

3. An oscillation control circuit according to claim 2, wherein the discrimination circuit comprises a shift register for storing a signal of multiple bits, which are sequentially supplied thereto based on the oscillation signal in a time-series manner in accordance with the clock signal, a decode circuit for decoding the signal of multiple bits to detect whether or not a combination of the multiple bits matches a prescribed combination of digits, thus producing a detection result, and a signal generation circuit for generating a signal for switching over a damping resistance incorporated in the oscillation circuit based on the detection result.

4. An oscillation control circuit according to claim 3, wherein the signal generation circuit comprises a timer for measuring a prescribed time period in accordance with the clock signal produced by the PLL circuit, and an order circuit for outputting a signal having a prescribed level for switching over the damping resistance during the prescribed time period when the decode circuit detects that the combination of the multiple bits matches the prescribed combination of digits.

5. An oscillation control circuit according to claim 3, wherein the signal generation circuit comprises a first timer for measuring a first time period in accordance with the clock signal produced by the PLL circuit, a first order circuit for outputting a first signal during the first time period when the decode circuit detects that the combination of the multiple bits matches the prescribed combination of digits, a second timer for measuring a second time period based on the first signal to produce a second signal, wherein the second time is initialized in time measurement in response to an output signal of the first order circuit, and a second order circuit for outputting a signal for switching over the damping resistance upon receipt of the second signal.

6. An oscillation control circuit according to claim 3, wherein the signal generation circuit comprises a timer for measuring a prescribed time period in accordance with the clock signal produced by the PLL circuit, thus outputting the signal for switching over the damping resistance, and an order circuit for sequentially receiving output signals of the decode circuit based on the oscillation signal, thus initializing the timer in time measurement based on the output signal of the decode circuit.

7. An oscillation control circuit adapted to an oscillation circuit, comprising:

a PLL circuit for producing a clock signal whose frequency is a multiple of a frequency of an oscillation signal, which is output from the oscillation circuit performing oscillation, wherein the PLL circuit controls the clock signal in phase to be synchronized with the oscillation signal;

a discrimination circuit for discriminating whether or not the PLL circuit is placed in a phase-locked state on the basis of a phase relationship between the oscillation signal and the clock signal, thus discriminating whether or not oscillation of the oscillation circuit is stabilized; and a gate circuit for blocking transmission of the clock signal derived from the oscillation signal therethrough in response to a discrimination result.

8. An oscillation control circuit according to claim 7, wherein the discrimination circuit comprises a shift register for storing a signal of multiple bits, which are sequentially supplied thereto based on the oscillation signal in a time-series manner in accordance with the clock signal, a decode circuit for decoding the signal of multiple bits to detect whether or not a combination of the multiple bits matches a prescribed combination of digits, thus producing a detection result, and a signal generation circuit for generating a signal for switching over a damping resistance incorporated in the oscillation circuit based on the detection result.

9. An oscillation control circuit according to claim 8, wherein the signal generation circuit comprises a timer for measuring a prescribed time period in accordance with the clock signal produced by the PLL circuit, and an order circuit for outputting a signal having a prescribed level for switching over the damping resistance during the prescribed time period when the decode circuit detects that the combination of the multiple bits matches the prescribed combination of digits.

10. An oscillation control circuit according to claim 8, wherein the signal generation circuit comprises a first timer for measuring a first time period in accordance with the clock signal produced by the PLL circuit, a first order circuit for outputting a first signal during the first time period when the decode circuit detects that the combination of the multiple bits matches the prescribed combination of digits, a second timer for measuring a second time period based on the first signal to produce a second signal, wherein the second time is initialized in time measurement in response to an output signal of the first order circuit, and a second order circuit for outputting a signal for switching over the damping resistance upon receipt of the second signal.

11. An oscillation control circuit according to claim 8, wherein the signal generation circuit comprises a timer for measuring a prescribed time period in accordance with the clock signal produced by the PLL circuit, thus outputting the signal for switching over the damping resistance, and an order circuit for sequentially receiving output signals of the decode circuit based on the oscillation signal, thus initializing the timer in time measurement based on the output signal of the decode circuit.

* * * * *